(12) United States Patent
Itoh

(10) Patent No.: US 10,319,430 B2
(45) Date of Patent: Jun. 11, 2019

(54) ULTRA-LOW-VOLTAGE CMOS CIRCUIT AND THE SAME FOR MEMORY

(71) Applicant: Etron Technology, Inc., Hsinchu (TW)

(72) Inventor: Kiyoo Itoh, Hsinchu (TW)

(73) Assignee: Etron Technology, Inc., Hsinchu (TW)

( * ) Notice: Subject to any disclaimer, the term of this patent is extended or adjusted under 35 U.S.C. 154(b) by 0 days.

(21) Appl. No.: 15/684,964

(22) Filed: Aug. 24, 2017

(65) Prior Publication Data

US 2018/0061486 A1    Mar. 1, 2018

Related U.S. Application Data

(60) Provisional application No. 62/378,692, filed on Aug. 24, 2016.

(51) Int. Cl.
*G11C 11/00* (2006.01)
*G11C 11/417* (2006.01)

(52) U.S. Cl.
CPC ................. *G11C 11/417* (2013.01)

(58) Field of Classification Search
CPC .................................................. G11C 11/417
USPC .......................................................... 365/154
See application file for complete search history.

(56) References Cited

U.S. PATENT DOCUMENTS

| 9,299,395 B2 | 3/2016 | Kulkarni | |
| 2007/0002617 A1* | 1/2007 | Houston | G11C 11/412 365/185.07 |

* cited by examiner

*Primary Examiner* — Hoai V Ho
(74) *Attorney, Agent, or Firm* — Winston Hsu

(57) ABSTRACT

A memory includes a plurality of memory cells and a plurality of peripheral circuits. Each memory cell has a first inverter and a second inverter, the first inverter is supplied by a first power supply rail and a second power supply rail, and the second inverter is supplied by a third power supply rail and a fourth power supply rail. A first voltage difference is applied across the first power supply rail and the second power supply rail, a second voltage difference is applied across the third power supply rail and the fourth power supply rail, and the first voltage difference is less than the second voltage difference. The plurality of peripheral circuits use at least one of boosted power supplies corresponding to the second voltage difference and gate-source differentially-driven circuits.

16 Claims, 36 Drawing Sheets

For NDRO,
$Vr < Vt(Mdb) - VSL$,
$Vr = 0.8 VBL$, $VBL = VDD/2$,
$Vr$; Ma-Md ratio.

ULTRA-LOW-VOLTAGE CMOS CIRCUIT AND THE SAME FOR MEMORY

CROSS REFERENCE TO RELATED APPLICATIONS

This application claims the benefit of U.S. Provisional Application No. 62/378,692, filed on Aug. 24, 2016 and entitled "Ultra-Low-Voltage CMOS Circuits and Applications to SRAMs," the contents of which are incorporated herein by reference.

BACKGROUND OF THE INVENTION

1. Field of the Invention

The present invention relates to a static random access memory, particularly to a static random access memory (SRAM), in which basic logic circuits never operate at low voltage at less than 0.5V (namely sub-0.5V) with low power and high speed.

2. Description of the Prior Art

FIG. 1(a) depicts a basic CMOS (complementary metal-oxide-semiconductor) inverter 100, wherein gate-over-drive (GOD) of a MOS is defined as subtraction of a threshold voltage Vt of the MOS from a gate-source voltage VGS (i.e., GOD=VGS−Vt) of the MOS. For example, as shown in FIG. 1(a), when an input X of the CMOS inverter 100 changes from 0V to a supply voltage VDD, GOD(Md) of a MOS Md is given as VDD−Vt(Md)±ΔVt, wherein /X is an output of the CMOS inverter 100. Here, Vt(Md) is a threshold voltage of the MOS Md, and ΔVt is variation of the threshold voltage Vt(Md) being increased with device scaling of the MOS Md. If the minimum operation voltage (VMIN) of Md is defined as the VDD when GOD(Md)=0, VMIN=Vt(Md)+ΔVt. Since there is a lower limit of Vt in terms of subthreshold leakage current, which is about 0.3-0.4V, VMIN=(0.3-0.4)V+ΔVt≅0.4-0.5V with an assumption of ΔVt≅0.1V. Obviously, speed becomes infinity at the above-defined VMIN. In practice, taking a speed margin into account, GOD must be larger than zero, thus allowing the practical VMIN to be higher than 0.4-0.5V, for example, 0.6V. Hence, sub-0.5V operations are impossible.

FIG. 1(b) depicts a 6T SRAM cell with six transistors, wherein it consists of two CMOS inverters, word line WL, and bit lines BL and /BL. Note that the 6T SRAM, composed of the 6T SRAM cells and peripheral circuits, is not suitable for sub-0.5V operations, because the 6T SRAM cell consists of above-described two CMOS inverters. To solve the issue, a voltage boosting was proposed in reference document [1]. In this scheme, a gate voltage of the inverter including Md and connecting to BL is boosted with boosted power supplies (BPS), namely, a positive boosting and a negative boosting, as explained below.

FIG. 2(a) depicts a boosting, in which a gate voltage with boosted power supplies (BPS) proposed in reference document [1], symbols of inverters using ZVT(low-Vt) and regular-Vt (RVT) MOS are shown in FIG. 2(b), which are used throughout the present invention. BPS-1 in FIG. 2(a) is an example using a low-Vt pMOS M1 as a load, and a regular-Vt (RVT) nMOS M2 as a driver. Here, assuming that the low-Vt and the RVT are 0V (ZVT) and 0.3V, respectively, BPS-1 is operable at high speed at VDD=0.3V due to GOD=0.3V for on-MOS (i.e. the RVT nMOS M2) with a gate-source-reverse bias of 0.3V for off-MOS (i.e. the low-Vt pMOS M1), if a boosted gate voltage VDH=0.6 V is applied. In contrast, the conventional (Conv.), however, doesn't work at all due to GOD=0 V. In addition, for BPS-2, in which both MOS use ZVT and a negative voltage −VSL is added as another gate voltage, it becomes fastest due to GOD=0.6V.

In the following, to avoid confusions in some cases due to using positive Vt (for nMOS) and negative Vt (for pMOS) under positive and negative power supplies, absolute values for the positive Vt and the negative Vt, namely, large Vt and small Vt are used.

FIG. 3(a) depicts a dynamic BPS scheme applied to a 5T SRAM cell 300 (proposed in reference document [2]), wherein a first (composed of MOS Ml, Md) inverter operates at a small (low) voltage VDD, and a second (composed of MOS Mlb, Mdb) inverter operates at boosted voltages, VDH and −VSL, only during active periods. As shown in FIG. 3(b), at a time T1, a signal WL for example transitions from −δ to VWL in order to select the 5T SRAM cell 300. Furthermore, at the time T1, a voltage on power line DHL rises from VDD to VDH, and a voltage on power line SLL falls from VSS to −VSL. A bit line BL is pre-charged to VDD/2, and thus, as in the example of FIG. 3(b), a voltage of the bit line BL either rises to VDD or falls to VSS depending on a value that is read from the 5T SRAM cell 300. In addition, at a time T2, a pre-charge circuit (not shown in FIG. 3(b)) is activated, and thus the voltage on the bit line BL returns to VDD/2.

FIG. 4(a) illustrates another prior art for low-voltage circuit (proposed in reference document [1]), a gate-source differentially-driven (GS-DD) scheme. FIG. 4(b) shows an application to a power switch for a circuit (or logic) block Z. While the circuit block Z is in an active state, a pMOS power switch is on with a terminal X at a voltage VDD and a terminal /X at 0V, so the voltage VDD is supplied to the circuit block Z. While it is off with the terminal X at 0V and terminal /X at the voltage VDD, the power is shut down for zero power. FIGS. 4(c) and 4(d) show cross-coupled nMOS and pMOS, respectively. FIGS. 5(a)-5(e) show prior arts of voltage shifters with the GS-DD scheme (proposed in reference document [1]) from 0.3V differential input to 0.6V differential output (0.3D−0.6D(1)) (shown in FIG. 5(a)), to 0.6V swing differential output (0.3D−0.6D(2)) (shown in FIG. 5(b)), and to 0.3V differential output (0.3D−0.3D) (shown in FIG. 5(c)), and from 0.6V differential input to 0.9V swing differential output (0.6D−0.9D) (shown in FIG. 5(d)) and to 0.9V single-ended input to 0.3V differential output (0.9S−0.3D) (shown in FIG. 5(e)), wherein FIGS. 5(a)-5(e) are applications of cross-coupled circuits shown in FIGS. 4(c) and (d).

Despite the two proposals of BPS and GS-DD, they are so primitive that basic yet practical circuits applicable to logic circuits in SoCs (System-on-Chips) remain unknown, calling for more-advanced and effective circuits of BPS and GS-DD. Even for an application of BPS to 5T SRAM cell, there are some issues, which must be solved, as follows. First, VDD is still as high as 0.5V despite strong need for sub-0.5V, thus calling for the 5T cell and peripheral circuits suitable for sub-0.5V (e.g., 0.3V) operations. In particular, since conventional circuits still suffice for 0.5V operations, there has been no proposal for sub-0.5V peripheral circuits despite need for BPS. Second, the total number of necessary power supplies was large, which is VDD=0.5V, VDH=0.7V, VSL=−0.2V, 0.25V (=VDD/2) and 1V for the peripheral circuits. Third, other arising issues, for example, desirable voltage relationships between memory cells and peripheral circuits, how to ensure operations over wide range of VDD under VDH and VSL, and how to balance "1" read speed with "0" read speed. How to use voltage shifters and how to ensure wide margin for sub-0.5V sensing are also concerns.

In the following, basic yet practical logic circuits applicable to SoCs are proposed, followed by the applications to sub-0.5V SRAMs and additional proposals.

SUMMARY OF THE INVENTION

An embodiment of the present invention provides a memory. The memory includes a plurality of memory cells and a plurality of peripheral circuits. Each memory cell of the plurality of memory cells has two inverters which are cross-coupled each other, a first inverter of the two inverters is connected to a bit-line and a second inverter of the two inverters and supplied by a first power supply rail and a second power supply rail and the second inverter is supplied by a third power supply rail and a fourth power supply rail, wherein a first voltage difference is applied across the first power supply rail and the second power supply rail, a second voltage difference is applied across the third power supply rail and the fourth power supply rail, and the first voltage difference is less than the second voltage difference. The plurality of peripheral circuits use at least one of boosted power supplies corresponding to the second voltage difference and gate-source differentially-driven circuits.

Another embodiment of the present invention provides a low voltage CMOS circuit. The low voltage CMOS circuit includes an input terminal, an output terminal, a shifter circuit, a receiver, an output buffer, and a booster circuit. The shifter circuit is coupled to the input terminal and configured to generate a pair of shifted signals. The receiver is coupled to the input terminal and the shifter circuit, the receiver configured to receive a input signal from the input terminal. The output buffer is coupled to the output terminal and configured to generate an output signal to the output terminal. The booster circuit is coupled to the output buffer, the receiver and the shifter circuit, and the booster circuit configured to generated a boosted signal. The boosted signal is coupled to a gate of an MOS in the output buffer, and the voltage swing of the boosted signal is greater than the voltage swing of the output signal.

Therefore, the present invention not only can allow basic logic circuits for SoCs (System-on-Chips) and SRAMs to operate at low voltage, low power and high speed, but also can reduce a necessary number of power-supply voltages of the static random access memory, if boosted power supply voltages for 5T SRAM cells are also used for peripheral circuits.

These and other objectives of the present invention will no doubt become obvious to those of ordinary skill in the art after reading the following detailed description of the preferred embodiment that is illustrated in the various figures and drawings.

DETAILED DESCRIPTION

Figure 6:
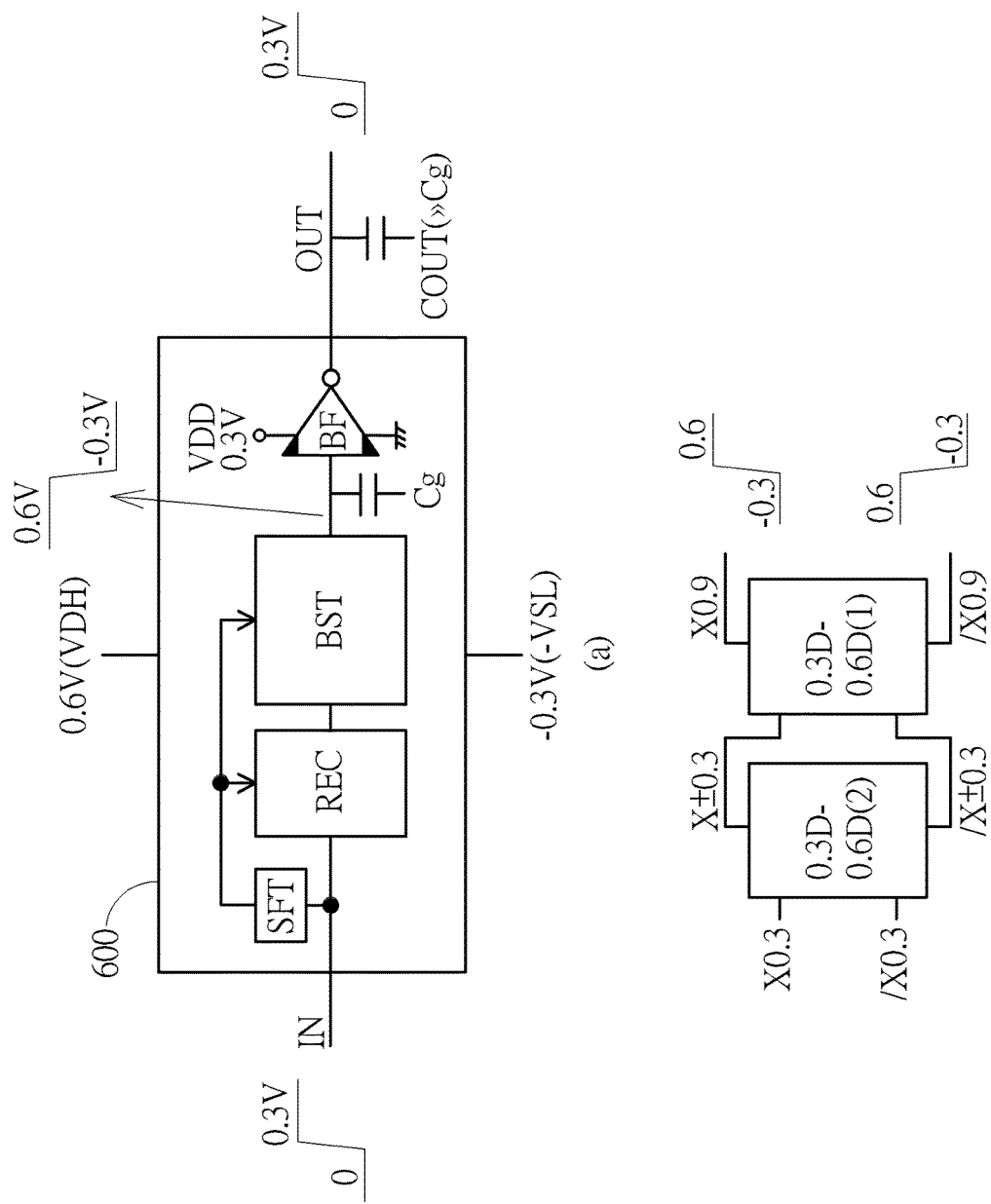
FIG. 6 depicts concepts of present inventions, exemplified by (a) low-power BPS and GS-DD circuit, and (b) shifter (SFT) constructed by two kinds of shifters in FIG. 5.

For a circuit 600 with a large output capacitance Cout to operate at low power and high speed, there is a concept of applications of BPS and GS-DD, as shown in FIG. 6. The circuit 600 is composed of a receiver REC, a BPS-booster BST, and an output buffer BF. The receiver REC can include a low-Vt (e.g., ZVT) circuit to receive a small voltage (0.3V) swing input IN. The booster BST includes a conventional high-Vt logic circuit operating at boosted voltages (VDH and −VSL). The output buffer BF includes a low-Vt (e.g., ZVT) inverter. At least the receiver REC and the booster BST are controlled by a shifter SFT. This concept is very effective for low power of long and large number of interconnect lines such as address lines and data-in and data-out lines. Note that if VDH and /or −VSL used in peripheral circuits are set to be same as those in 5T memory cells, a number of power supplies as the while SRAM are reduced, enabling low-cost and simple design. The details are explained later. In any event, a concept of an application of the circuit 600 is shown as follows:

(1) Reduce a voltage swing on an output capacitance Cout by applying a small voltage VDD to the output buffer BF, and use the output buffer BF composed of low-Vt MOS (e.g., ZVT) to offset resultant slow speed, wherein the voltage swing on the output capacitance Cout can be smaller than an input voltage swing of the circuit 600. An output terminal OUT of the circuit 600 thus operates at low power and high speed despite the large output capacitance Cout.

Figure 5:
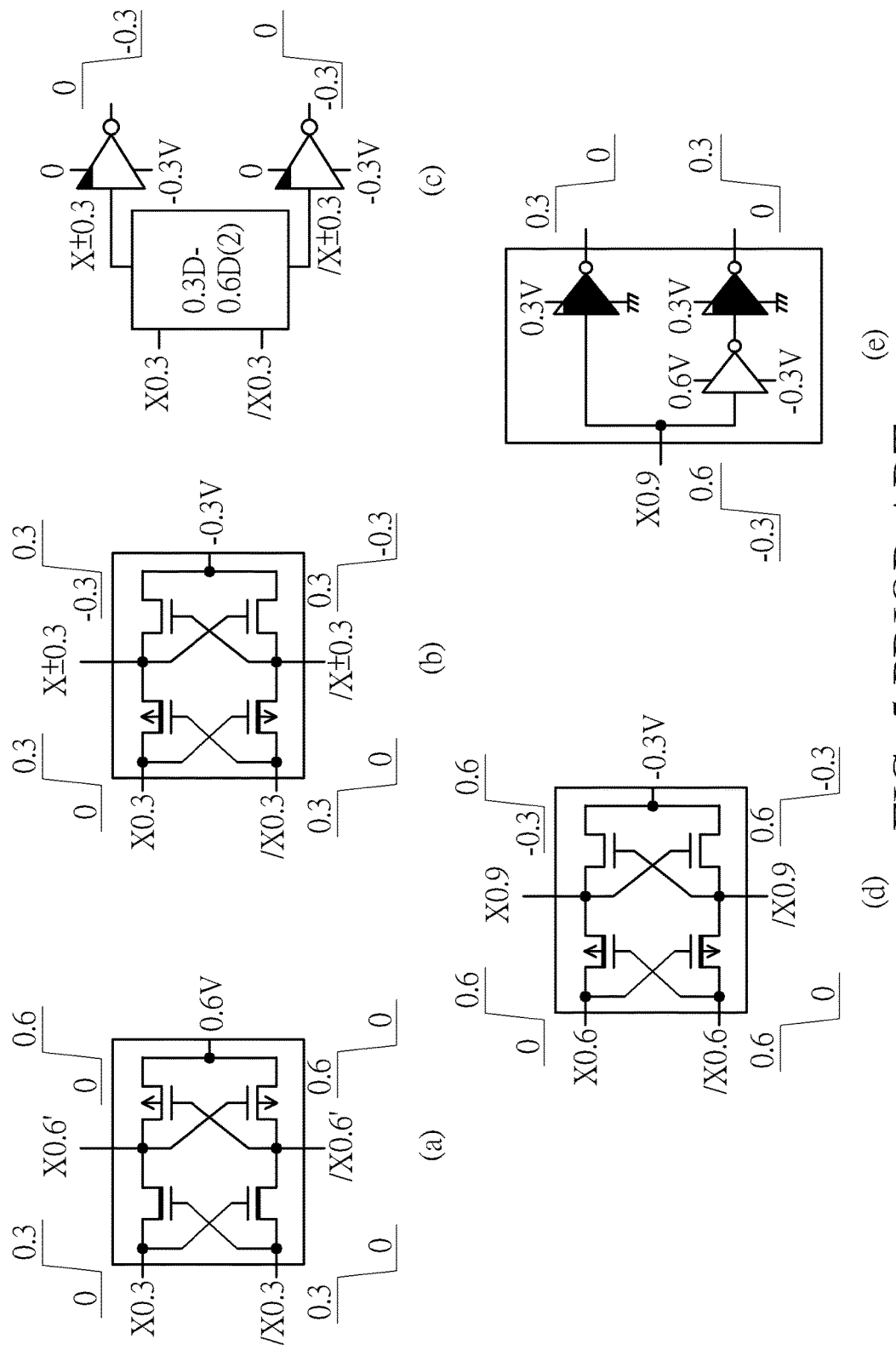
FIG. 5 depicts prior art of voltage shifters with GS-DD scheme from 0.3-V differential input to (a) 0.6-V differential output (0.3D–0.6D(1)), (b) 0.6-V swing differential output (0.3D–0.6D(2)), and (c) 0.3-V differential output (0.3D–0.3D), and from (d) 0.6-V differential input to 0.9-V swing differential output (0.6D–0.9D) and (e) 0.9-V single-ended input to 0.3-V differential output (0.9S–0.3D).

(2) Drive the output buffer BF with the BPS-booster BST, so the BPS-booster BST drives the output buffer BF with a large voltage swing from VDH(=0.6V) to −VSL(−0.3V) for more quickly driving the output capacitance Cout. Such a large voltage swing is generated, for example, by the shifter SFT (0.3D–0.9D) with a 0.3V differential input (wherein 0.3V at terminal X and 0.3V at terminal /X) from the receiver REC. Here, the shifter SFT is composed of a series-connection of cross-coupled circuits 0.3D–0.6D(2) and 0.3D–0.6D(1) (shown in FIGS. 5(b), 5(a)). Increase in BST-power due to boosted power supply (BPS) is small if a node capacitance Cg is kept small. Of course, leakage currents are small thanks to the output buffer BF using the BPS scheme and large-Vt MOS in the BPS-booster BST. In the following, key circuits using the principle, applicable to SoCs, are proposed.

FIG. 7(a) depicts a more-detailed basic circuit 700 working as a driver or inverter. It features all inputs and outputs operating at 0.3V swing, while internal nodes (i.e., N1 and N2) operate at 0.6V–0.9V swing. A receiver REC is composed of a first GS-DD switch (nMOS Mn) to activate Z and a large (or high) −Vt pMOS Mp operating at 0.6V. Here, Z is a logic or circuit block, P and P' are precharge pulses or clocks, and X denotes a 0.3V input pulse to Z. A booster BST consists of a large-Vt inverter IV operating at boosted supplies of 0.6V and −0.3V, and a second GS-DD switch (nMOS Mnp) to precharge the internal node N2. A buffer BF is composed of a SFT(0.9S–0.3D) to convert a 0.9V swing single-ended pulse from the internal node N2 to a 0.3V differential outputs X0 and /X0. It should be noted that the inverter IV speeds up the feedback loop consisting of the internal node N1, the inverter IV, the internal node N2 and the pMOS Mp, without leakage, as follows. As shown in FIG. 7(b), at a beginning (i.e., a precharge period T1 with 0.3V precharge pulse), the nMOS Mn is off due to GS-DD, and the pMOS Mp is on due to the internal node N2 being precharged to a low level (i.e., −0.3V), wherein the internal node N2 is precharged by the nMOS Mnp with another pulse set of P' and /P' made by a first shifter SFT1 (0.3D–0.3D) (shown in FIG. 7(a)).

Therefore, the internal node N1 quickly goes to 0.6V if the input pulse X is 0V and Z is thus off because a small voltage swing (−0.3V) developed at the internal node N2 by the nMOS Mnp makes the pMOS Mp and then the inverter IV on. Eventually, the internal nodes N2 and N1 quickly go to −0.3V and 0.6V thanks to the feedback loop. When an active period T2 starts with the precharge pulse P going to 0V, the operation is also quickly done with the help of the feedback loop. In the active period T2, Z starts to be evaluated by turning on the nMOS Mn. If Z remains off, the differential outputs X0 and /X0 remain to the original (shown in FIG. 7(b)). If Z is on, the differential outputs X0 and /X0 are quickly switched to 0V and 0.3V, respectively (shown in FIG. 7(b)). In this case, at the beginning a small voltage swing is developed at the internal node N1 as a result of a ratio operation of the pMOS Mp, Z, and the nMOS Mn, and then the small voltage swing is amplified by the inverter IV. Resultant positive-going voltage at the internal node N2 tends to make the pMOS Mp off, so that the original voltage swing at the internal node N1 is bigger with a larger ratio operation. Eventually, the internal nodes N1 and N2 quickly go to 0V and 0.6V, allowing the differential outputs X0 and /X0 to be 0V and 0.3V, respectively. Note that in the circuit 700 (shown in FIG. 7(a)), the differential outputs X0 and /X0 during the precharge period T1 are fixed to 0.3V and 0V, respectively.

Figure 7:
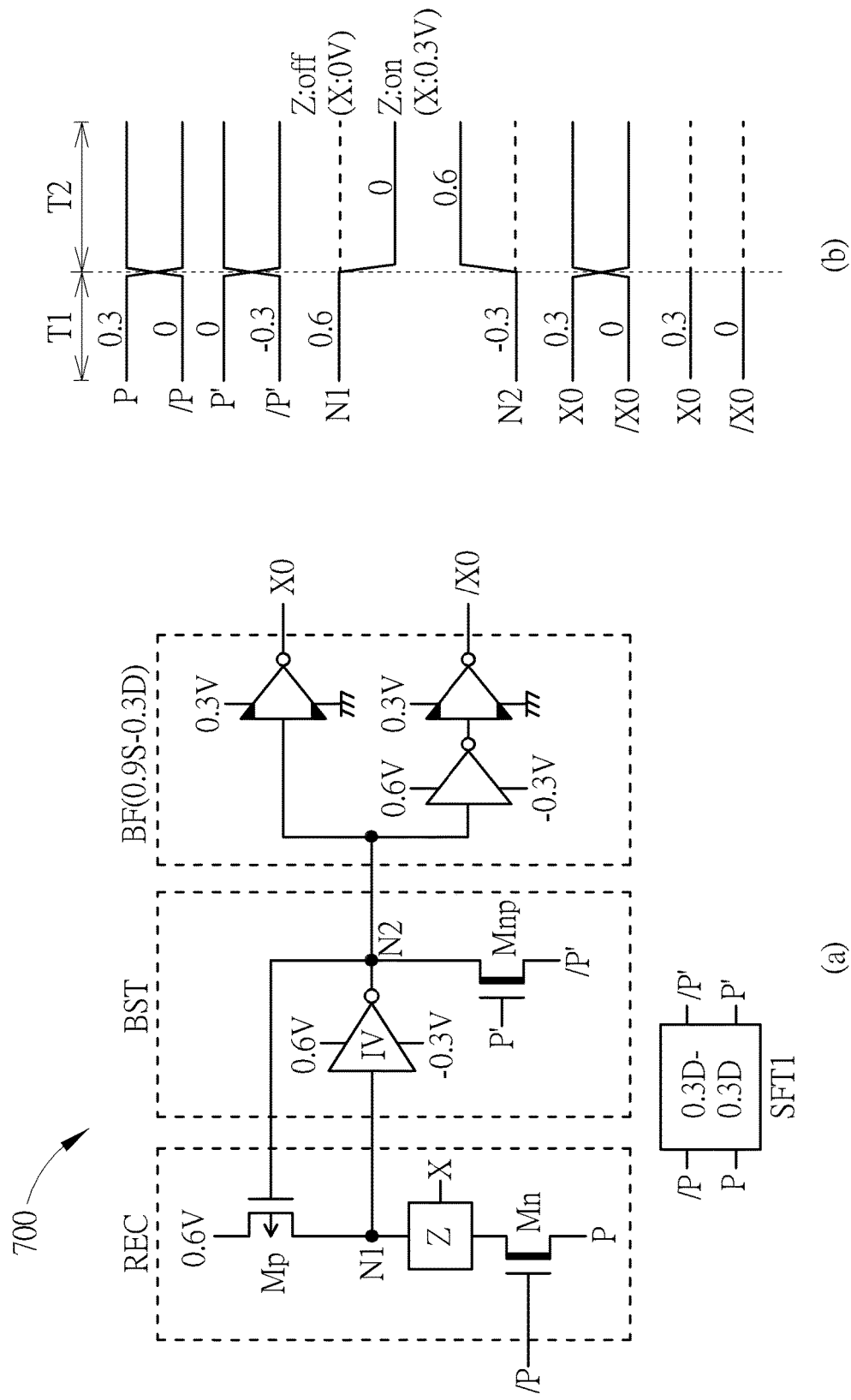
FIG. 7 depicts a basic circuit utilizing receiver (REC), booster (BST), and buffer (BF) constructed by a shifter (0.9S–0.3D) in FIG. 5(e).
Figure 8:
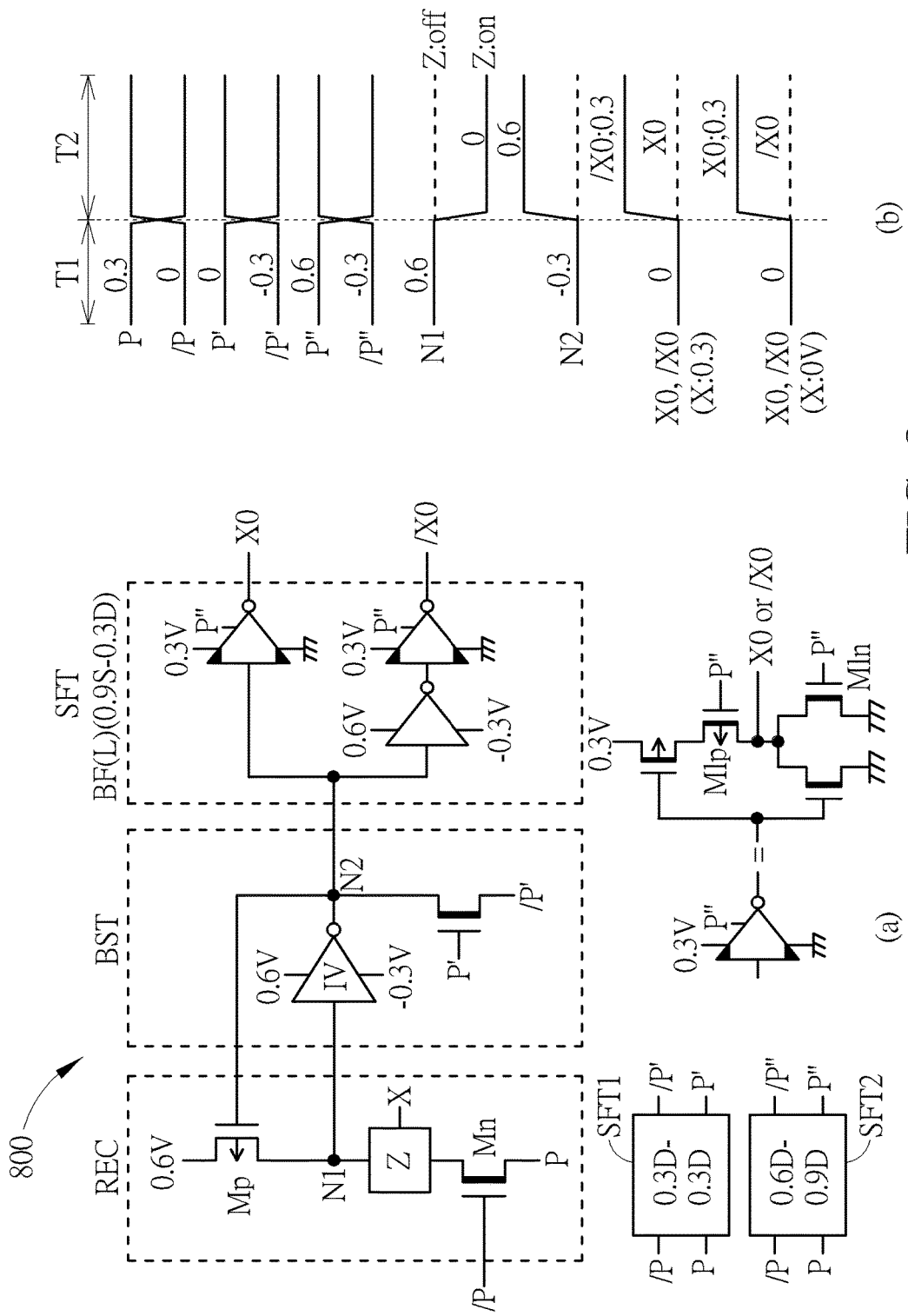
FIG. 8 depicts another basic circuit, in which outputs are latched to 0V during unnecessary periods.

FIG. 8(a) shows another basic circuit 800. In the basic circuit 800, both differential outputs X0 and /X0 during a precharge period T1 are unconditionally latched to 0V with a pMOS Mlp and an nMOS Mln controlled by a second shifter SFT2 (0.6D–0.9D). Both the circuits 700, 800 shown in FIGS. 7 and 8 provide various practical configurations, depending on Z. In fact, Z can consist of not only a logic circuit block but also MOS or only a connection of the internal node N1 to the nMOS Mn without Z. In addition, FIG. 8(b) illustrates corresponding timings.

FIG. 9(a) illustrates a precharge (or clock) buffer 900, which is regarded as the circuit 700 (shown in FIG. 7) without Z. The precharge buffer 900 allows an input pulse P to be translated to a pair of output differential pulses P0 and /P0, with a strong driving capability that is enabled by making the buffer BF strong. In addition, FIG. 9(b) illustrates a circuit symbol of the precharge buffer 900, and FIG. 9(c) illustrates corresponding timings.

Figure 10:
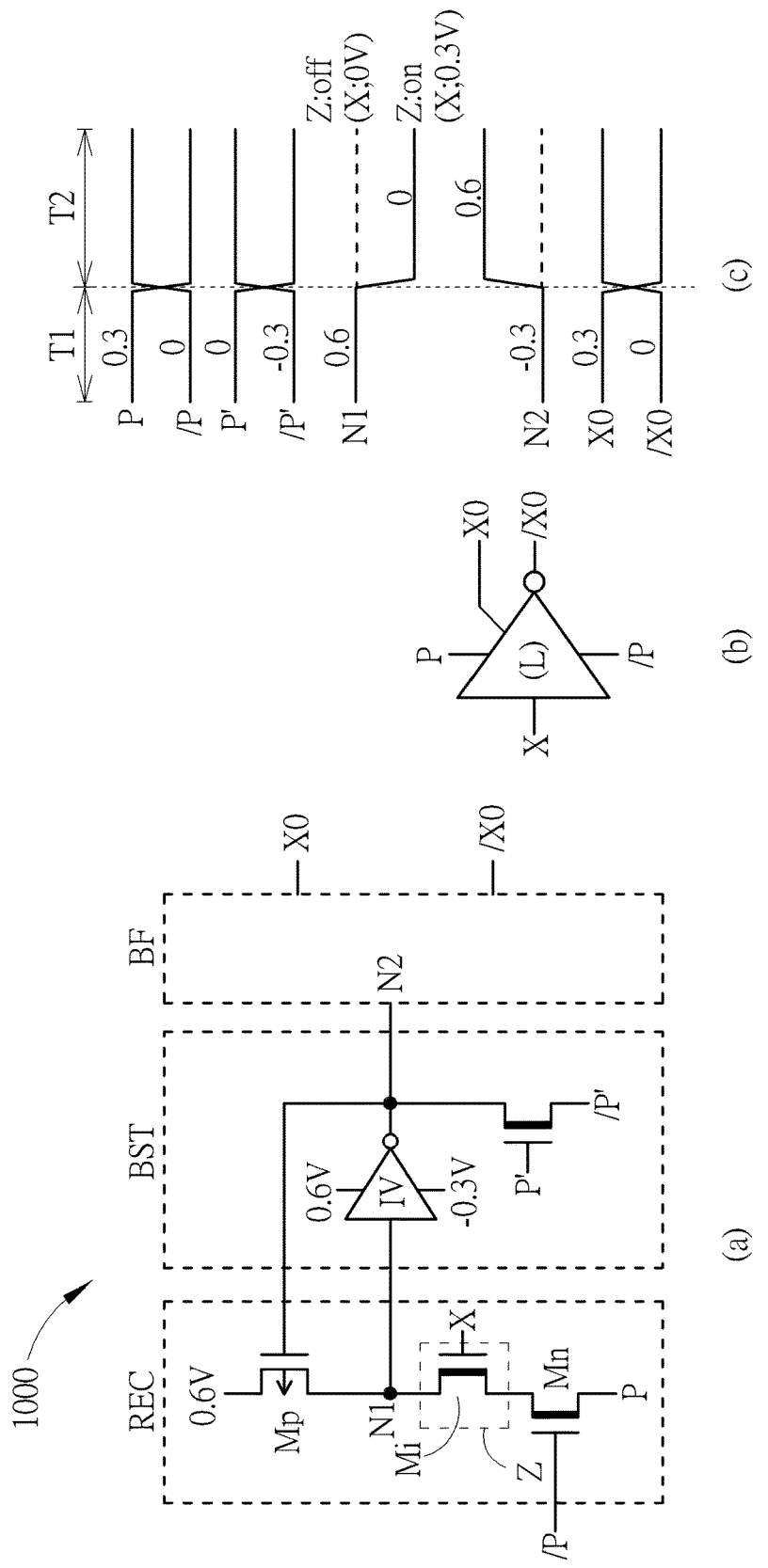
FIG. 10 depicts (a) driver controlled by precharge pulses, and (b) its symbol.

FIG. 10(a) shows an address buffer 1000 with Z consisting of one nMOS Mi. Only when an input X is at "high" (=0.3V), differential outputs X0 and /X0 change to opposite states. In addition, FIG. 10(b) illustrates a circuit symbol of the address buffer 1000, and FIG. 10(c) illustrates corresponding timings.

Figure 11:
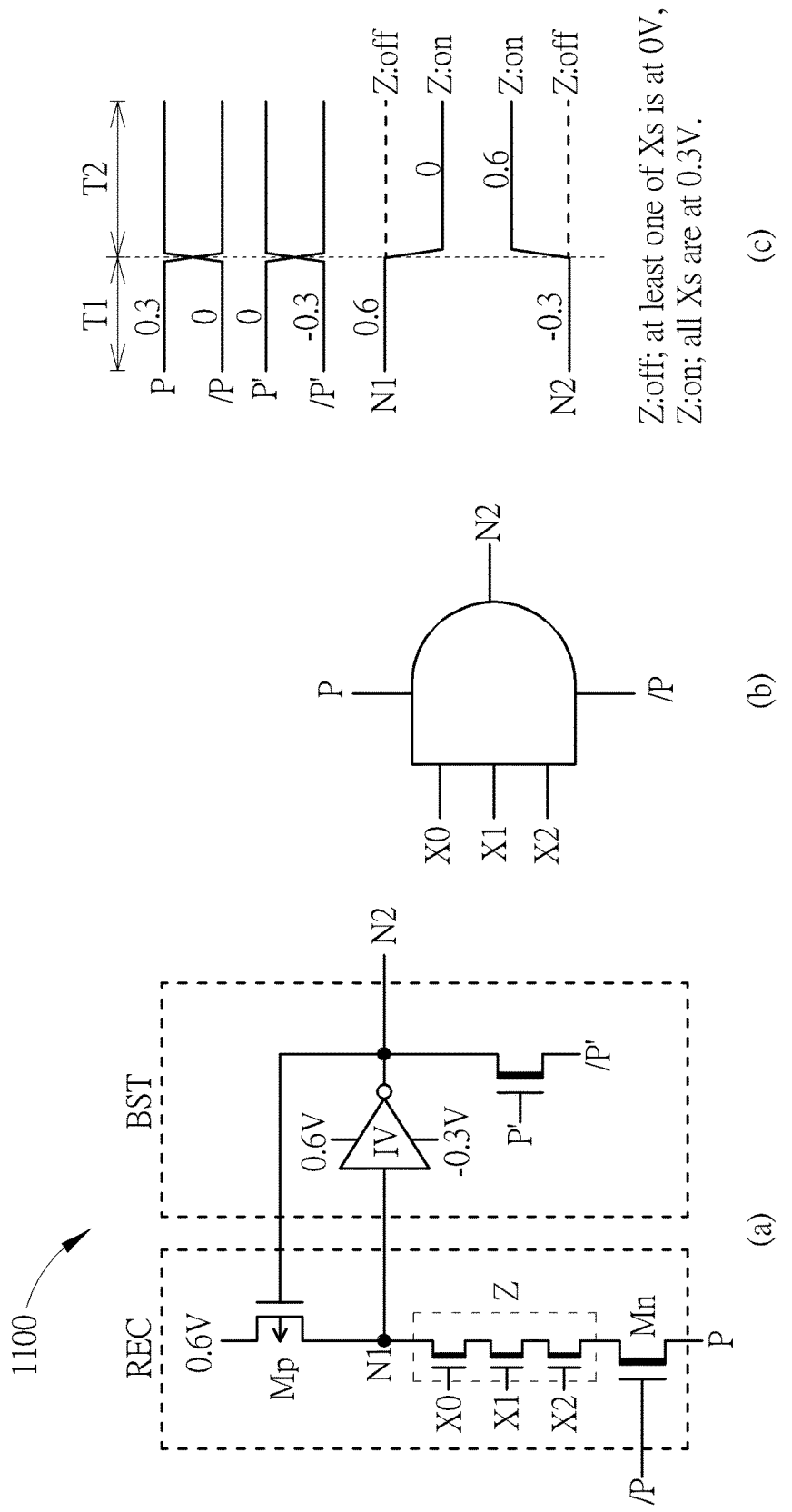
FIG. 11 depicts a NAND gate, its symbol, and a corresponding timings.

FIG. 11(a) depicts a three-input NAND gate 1100 controlled by three inputs X0-X2. When a precharge pulse P goes to low, an inter node N1, precharged to 0.6V with a precharge pulse P' and a PMOS Mp, is discharged or remains to 0.6V, depending on the inputs X0-X2. Only when the all inputs X0-X2 are high, the inter node N1 is discharged. In addition, FIG. 11(b) illustrates a circuit symbol of the three-input NAND gate 1100, and FIG. 11(c) illustrates corresponding timings. In another embodiment of the present invention, FIG. 11(a) can be implemented as a three-input AND gate controlled by three inputs X0-X2 in a similar way.

Figure 12:
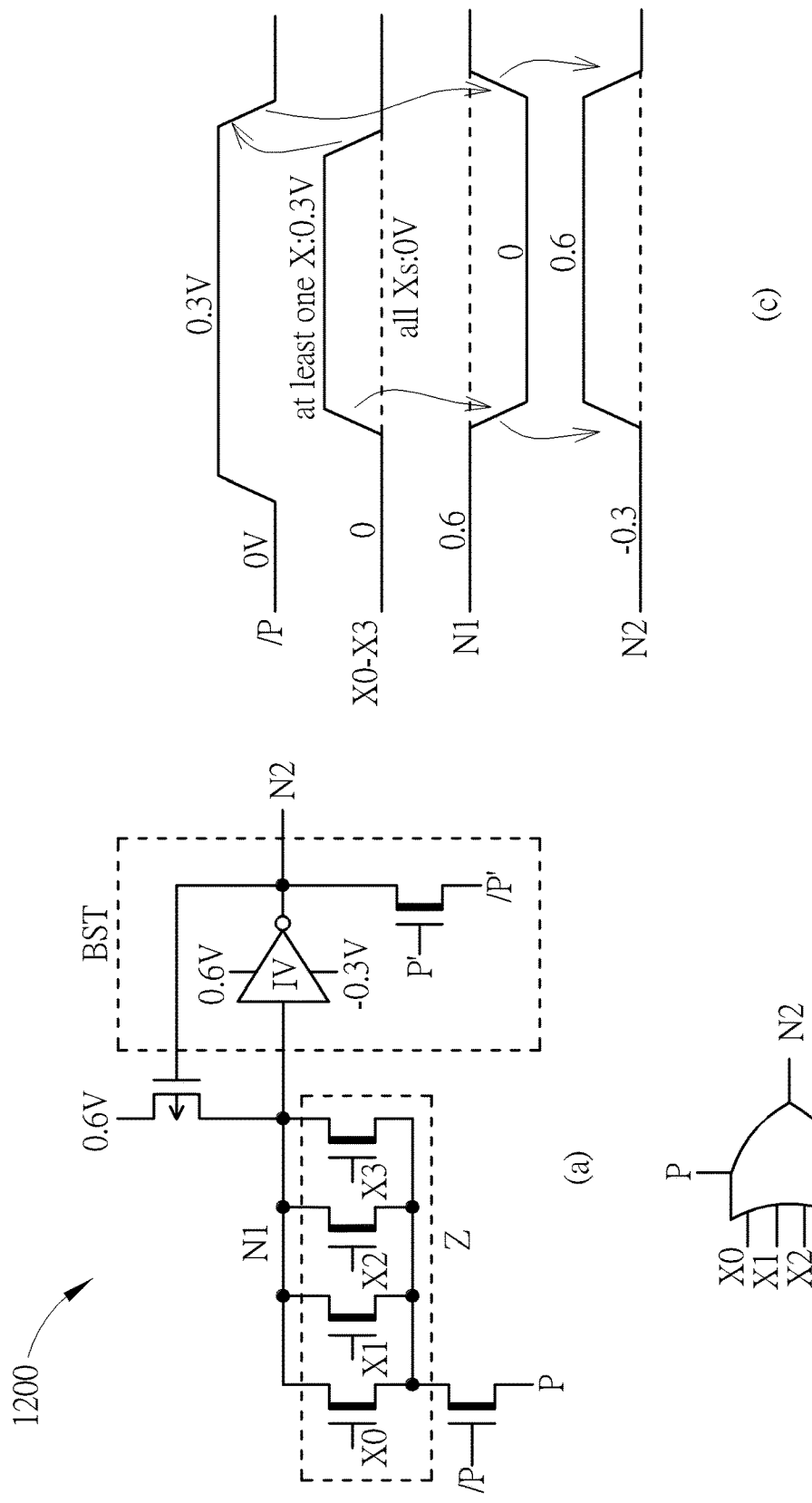
FIG. 12 depicts a NOR gate, its symbol, and a corresponding timings.

FIG. 12(a) shows a four-input NOR gate 1200, composed of four parallel-connected nMOS. When at least one of inputs X0-X3 is high, an output N2 is charged up. In addition, FIG. 12(b) illustrates a circuit symbol of the four-input NOR gate 1200, and FIG. 12(c) illustrates corresponding timings. In addition, in another embodiment of the present invention, FIG. 12(a) can be implemented as a four-input OR gate, composed of four parallel-connected nMOS, in a similar way. Obviously, NOR gate is much faster than NAND gate that is disadvantageous in speed, especially at low voltage operations, due to plural stacked MOSFETs. Hence, in some cases, application of NAND gate to address decoders of SRAMs, in which four-stacked MOSFETs are usually used, is strictly limited for high-speed SRAMs. Even so, when such a NOR gate is applied to address decoders, each of which is connected to a word line in SRAM, it increases dynamic power dissipation of address decoders. This is because all decoder output nodes (plural N1s), except selected one, are discharged. This drawback is overcome by selectively turning on MOS transistor controlled by p and /p (p and /p MOS) in the figure. In such a case, all the decoders are divided into plural blocks, and only one block including the selected decoder is activated, while other blocks are disabled. This scheme is done by selectively controlling the p and /p MOS. Namely, all non-selective blocks are disabled by turning off the corresponding p and /p MOS, while the selected block is enabled by turning on the p and /p MOS.

Figure 13:
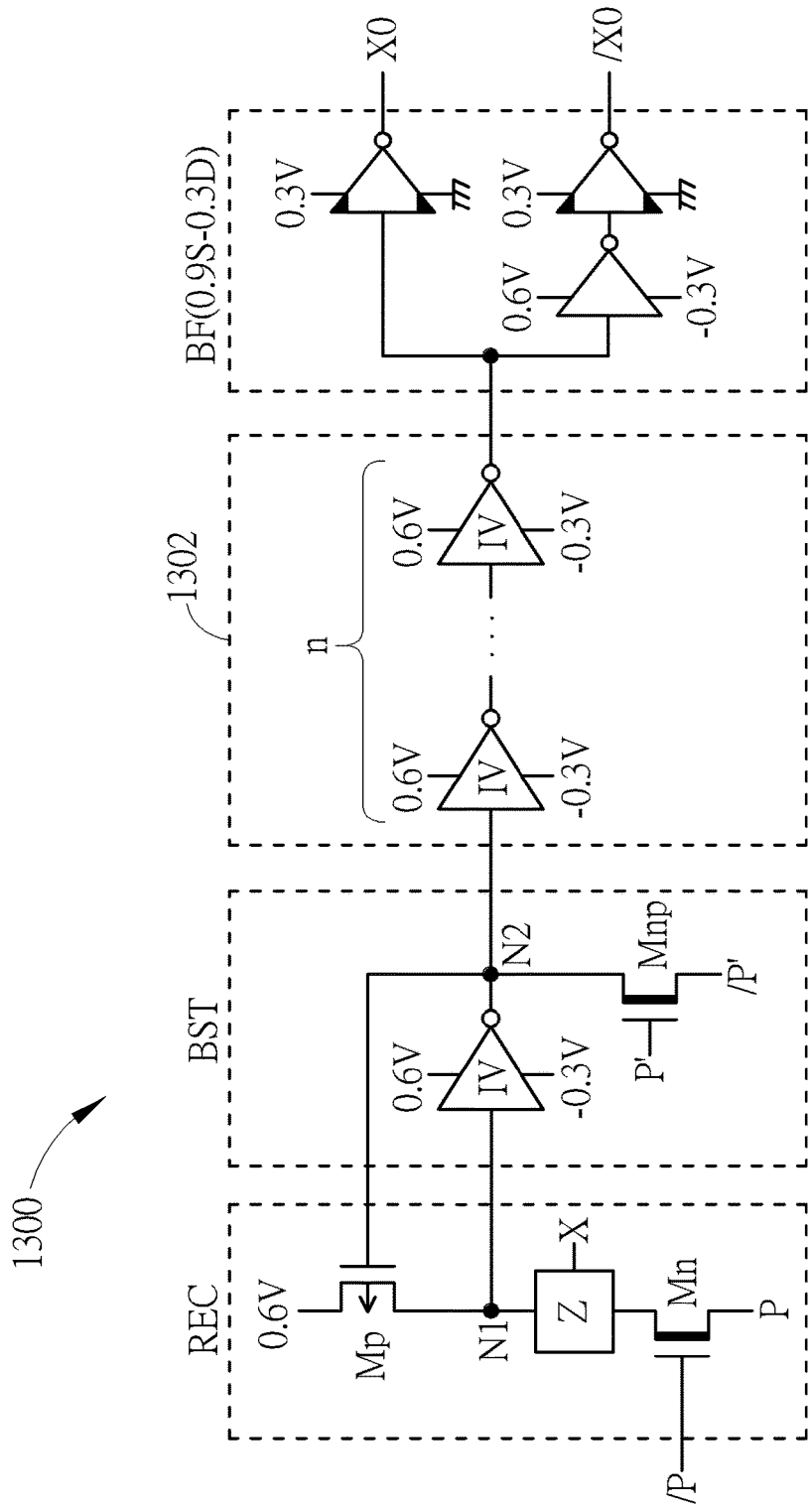
FIG. 13 depicts inverter chain for delay, inserted between BST and BF.
Figure 14:
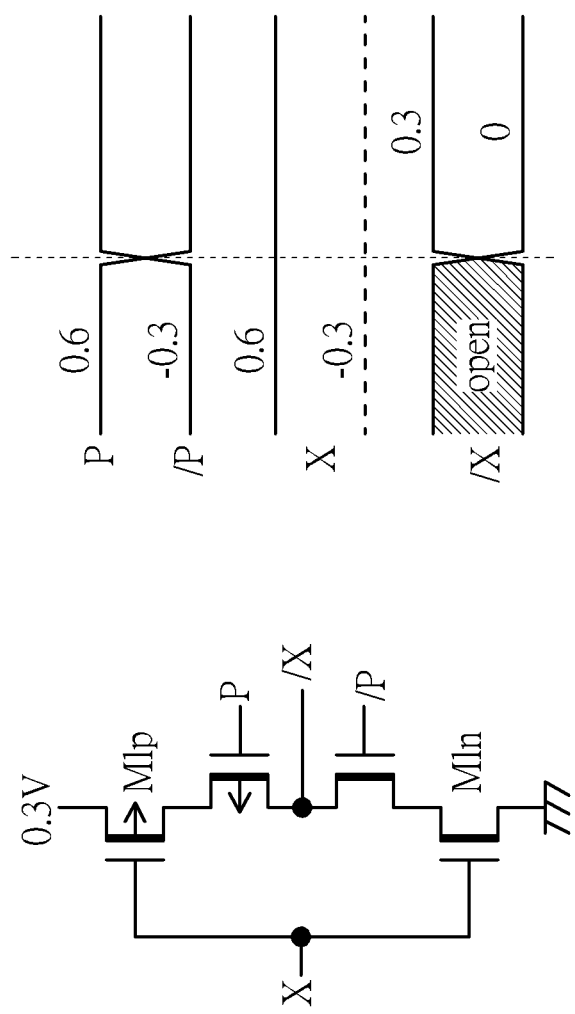
FIG. 14 depicts a Wired OR gate and a corresponding timings.

FIG. 13 shows a delay circuit 1300, in which an inverter chain 1302 is inserted between a booster BST and a buffer BF, wherein the inverter chain 1302 is an n-stage large-Vt inverter chain operating at boosted supply voltage consists of a delay without leakage. FIG. 14 illustrates wired OR gate, in which an input X is isolated from an output /X during unnecessary periods by an isolation pulse P.

All the above-described circuits can be used for controlling logic blocks and memory-cell arrays in SoCs.

The previous 5T SRAM (proposed in reference document [2]) with a 28-nm Fully-Depleted SOI device was for 0.5V operations. Hence, the peripheral circuits were manageable with conventional CMOS circuits. When a voltage VDD is lowered to sub-0.5V (e.g., 0.3V), however, reliable and fast operations of the peripheral circuits are impossible any more, calling for innovative circuits as described so far. The inherent circuits of the 5T SRAM, such as sense amplifiers, must be also investigated in terms of low-voltage operations. Even for the memory cell array, despite using the same 5T cell in the previous SRAM, additional inventions are necessary for sub-0.5V operations.

In this section, first, an assumed 5T SRAM array is explained. Second, applications of the above-mentioned circuits to the peripheral circuits are exemplified, followed by a proposal of sense-amplifier layout suitable for low-voltage operations. Third, the number of the necessary power supply is investigated, and an appropriate voltage setting to reduce the number is proposed. Fourth, favorable relationships of boosted power supply between 5T cells and peripheral circuits are proposed to widen voltage margins of the 5T SRAM. Fifth, two invented 5T cells and relevant arrays are discussed.

(1) Array Architecture

Figure 15:
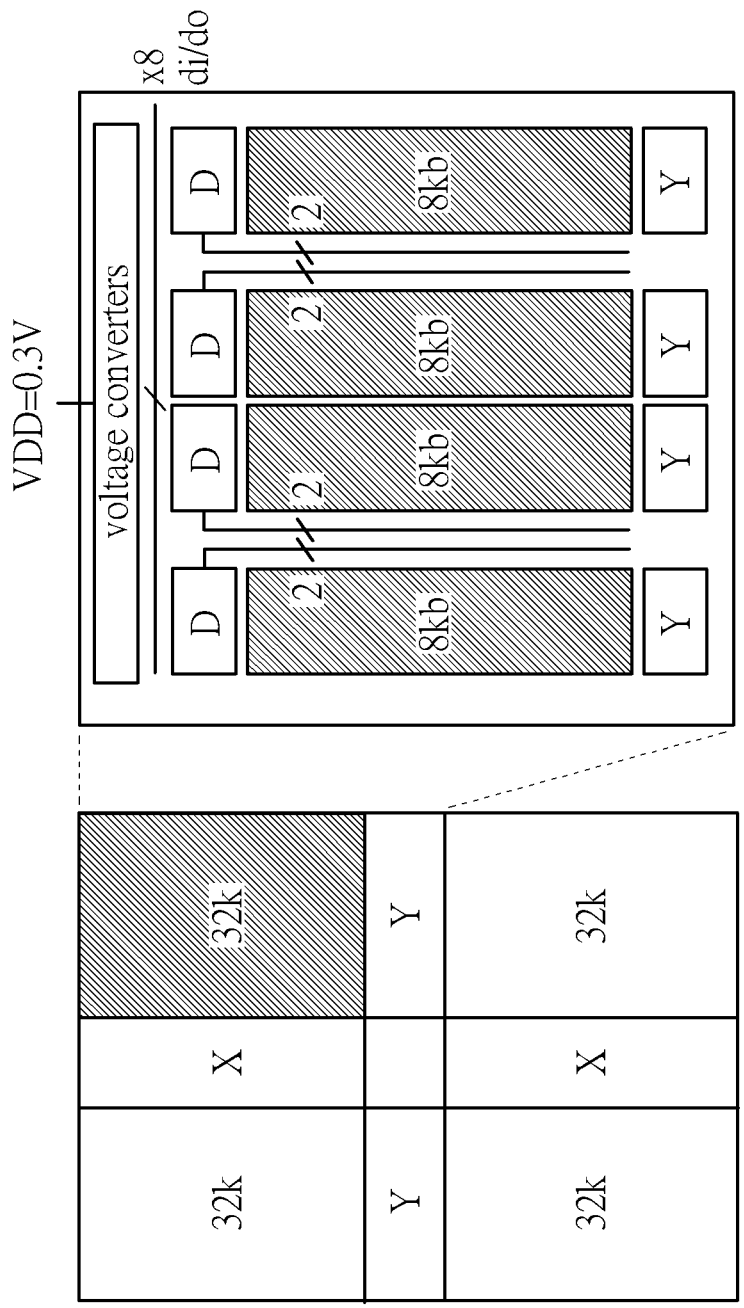
FIG. 15 depicts architecture of 128-kb embedded SRAM applying BPS and GS-DD.

FIG. 15 shows an assumed 128-kb embedded SRAM, in which each 32-kb array consists of four 8-kb sub-arrays, and BPS is used in 5T cells, as previously proposed document [2], wherein X represents row decoders & drivers, Y represents column decoders & drivers, and D represents data in & data out circuit.

Figure 16:
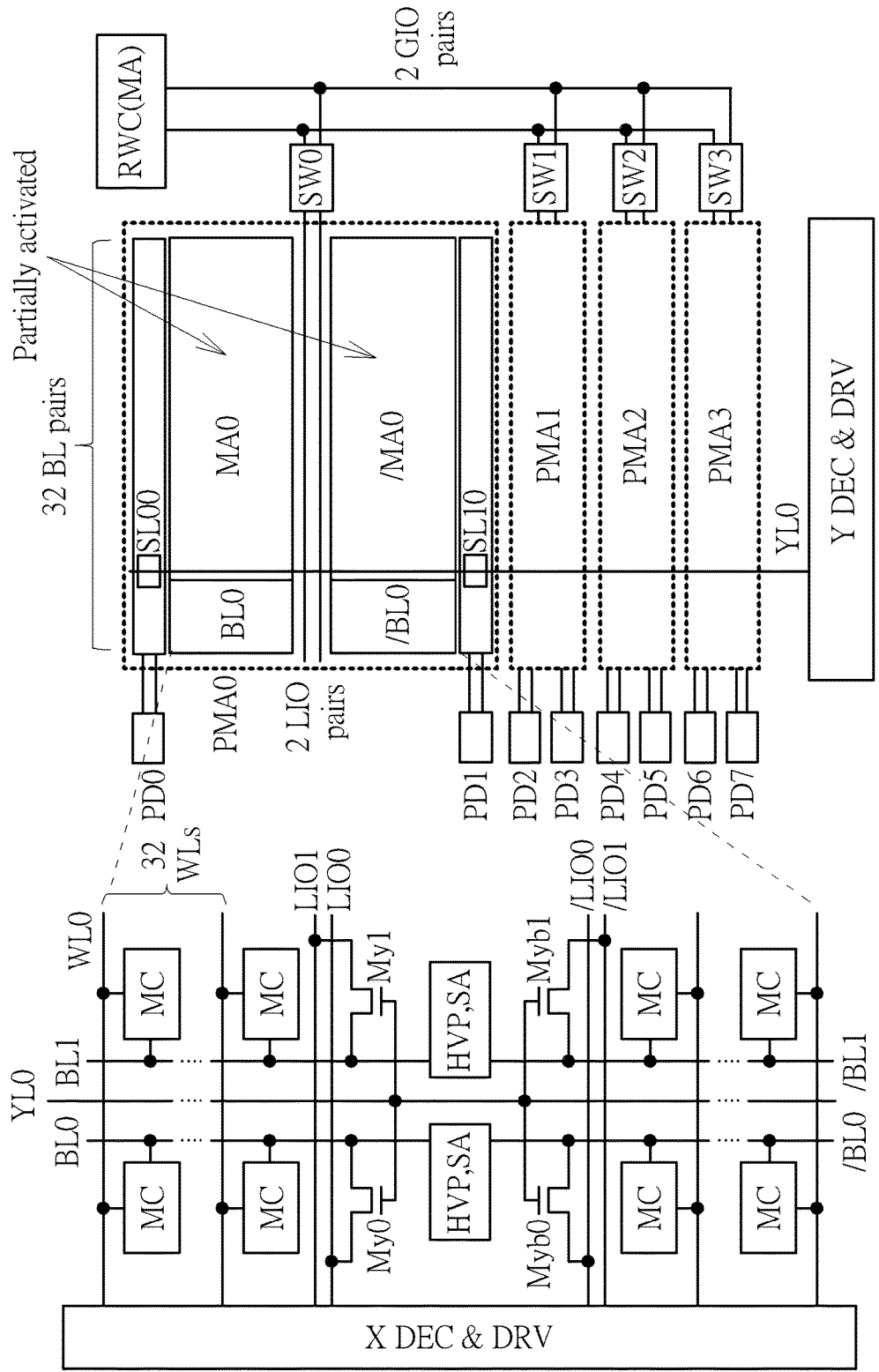
FIG. 16 depicts (a) BL-configuration controlled by column lines, and (b) 8-divided-BL 8-kb array.

FIG. 16 depicts a BL-configuration and an 8-kb sub-array. Each pair of bit lines (BLs) (e.g., BL0 and /BL0) is arranged in an open-BL (FIG. 16(a)), and divided into eight, as shown in FIG. 16(b). This is done without a substantial area increase at each division since each column line YL works as a column selection line (proposed reference document [2]). Here, each of pair of sub-arrays (e.g., PMA0) has a power driver (PD0) and selector (SL00) to selectively and thus partially boost the power lines DHL and SLL (not shown in FIGS. 16(a), 16(b)) in the BL direction for low active power of cells. This is done by activate the SL at coincidence of selected YL and selected PD. In addition, as shown in FIGS. 16(a), 16(b), MC represents memory cell, LIOx represents input/output lines, MOS Myl, My0, Myb0, Myb0 are switches, HVP,SA represents pre-charge, sense amplifier circuit, PMAx represents memory sub-array, YL0 represents column line, SWx represents switch selectively controlled by row address signal, GIO represents global input/output line, RWC(MA) represents read write circuit, and wherein X DEC & DRV represents row decoders & drivers, Y DEC & DRV represents column decoders & drivers.

Although the array configuration is similar to the prior art (reference document [2]), power supply voltages are totally different. For the prior art (reference document [2]), conventional circuits are used due to VDD=0.5V, as mentioned before. In fact, major power supply voltages in the present invention are, for example, VDD=0.3V, VDH=0.6V, and VSL=-0.3V, which differs from 0.5V, 0.7V, and -0.2V, respectively, for the previous 0.5V SRAM (proposed reference document [2]). Here, it is assumed that a voltage VDD is an external power supply, while voltages VDH and VSL are internally generated. In addition, both BPS and GS-DD are incorporated in peripheral circuits, as explained below. Here, well-established on-chip voltage converters for DRAMs (proposed in reference document [3]) can be fully utilized for SRAMs.

(2) Peripheral Circuits

The most effective circuit block applying BPS and GS-DD schemes is BL-relevant circuits. In fact, BL power is usually largest, because as many as 256 pairs of BLs in a 128-kb array (see FIG. 15), each of which has a large BL-capacitance, are simultaneously charged or discharged at 0.15V swing. Fortunately, however, the power issue has been solved by prior-art dynamic BPS 5T cells despite 0.5V VDD (proposed in reference document [2]). Other effective circuits are precharge buffers, address buffers, and DHL and SLL buffers, since they have relatively long lines and thus large load capacitances and /or many lines are simultaneously driven. Obviously, above-described circuits based on the concept shown in FIG. 6 are applicable to these peripheral circuits.

Figure 9:
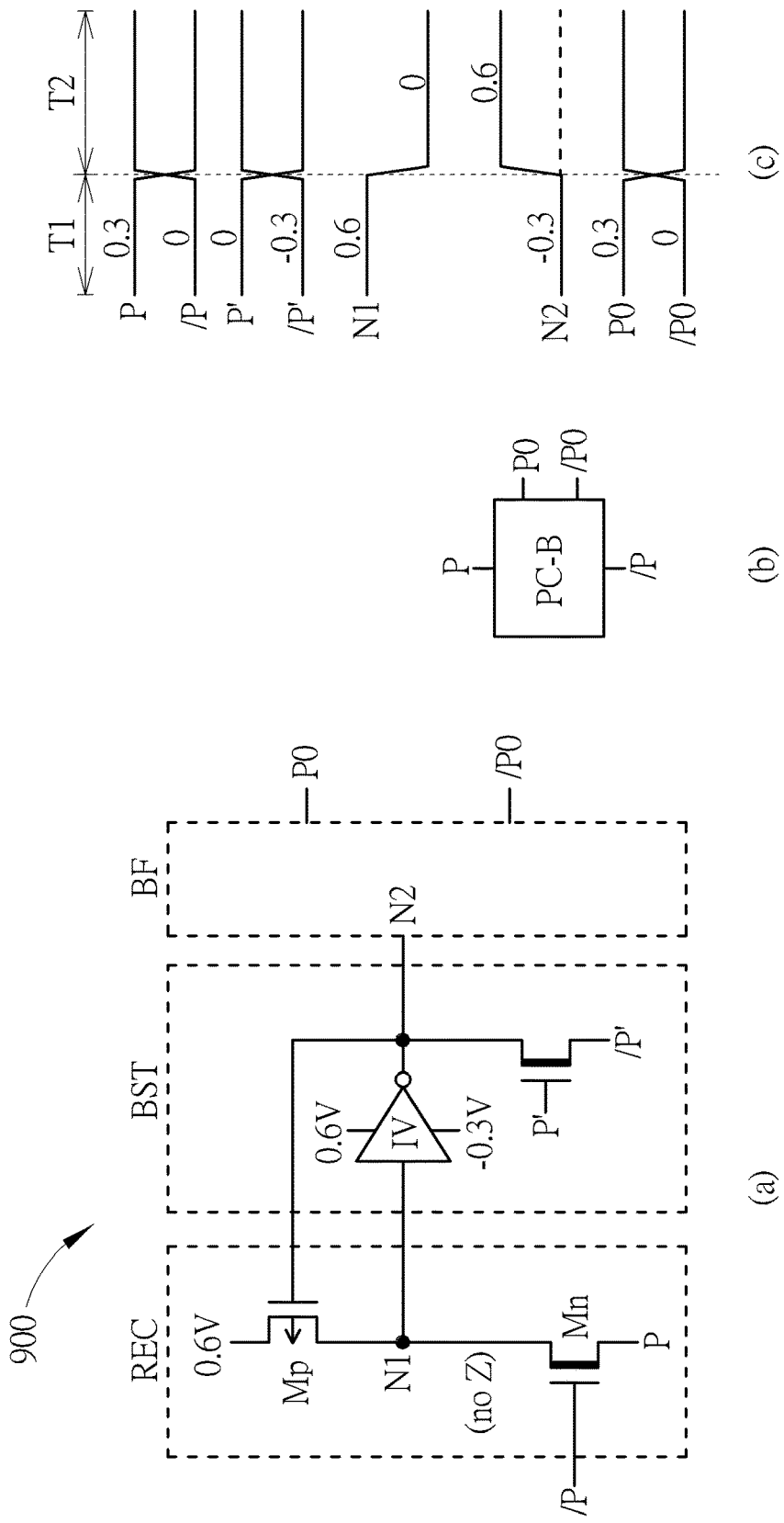
FIG. 9 depicts (a) precharge buffer (PC-B) for differential pulses, and (b) its circuit symbol.
Figure 17:
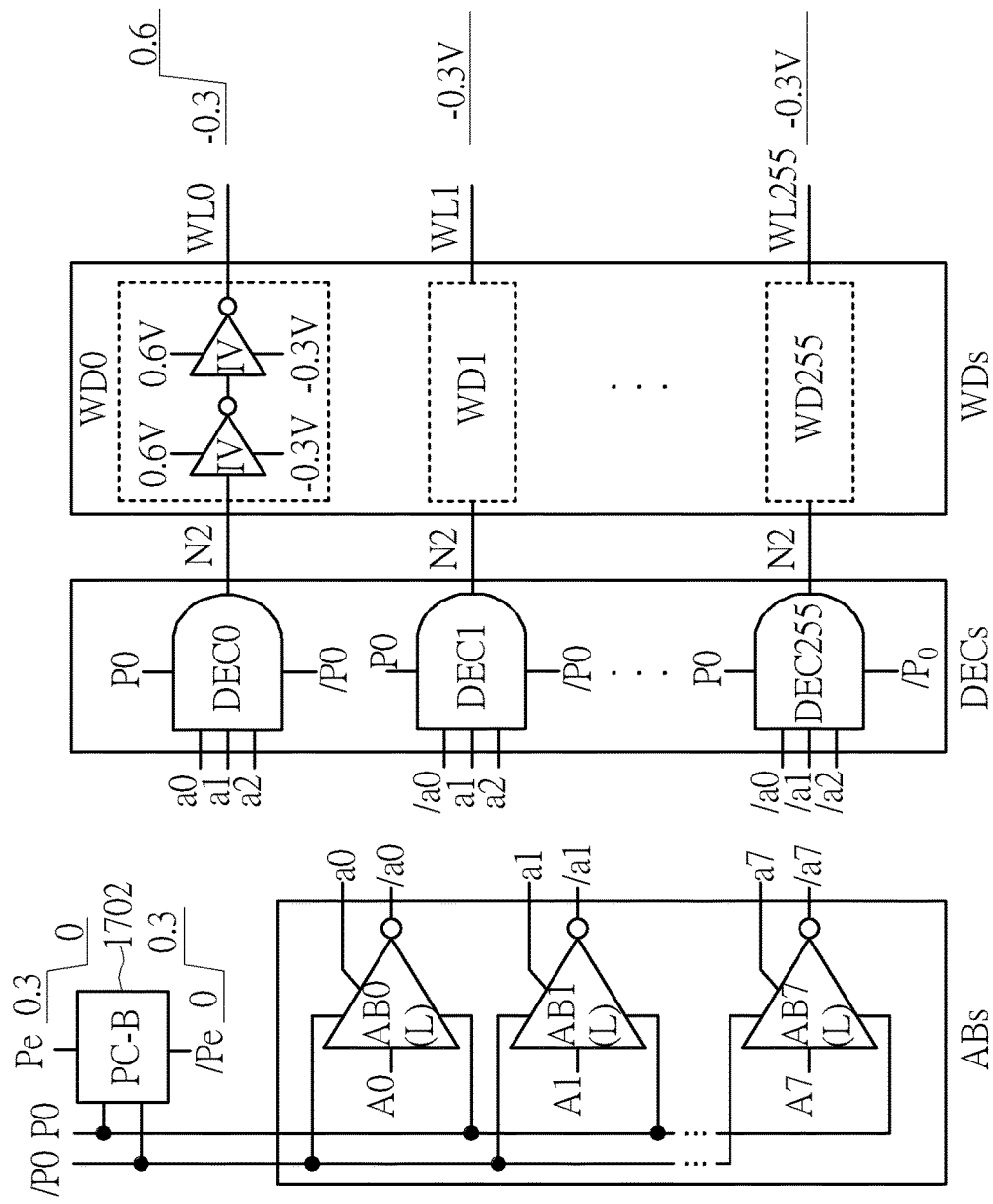
FIG. 17 depicts circuits of address buffers (ABs), decoders (DECs), and word drivers (WDs).

FIG. 17 shows row-relevant circuits exemplified by pre-charge buffer (PC-B) 1702 (shown in FIG. 9(a)), eight address buffers AB0(L)-AB7(L) (shown in FIG. 10(a)), 256 address decoders (row-NAND-decoders) DEC0-DEC255 (shown in FIG. 11(a) and FIG. 12(a)), and 256 word-line drivers WD0-WD255. At first, 0.3V external differential precharge pulses, Pe and /Pe, which correspond to P and /P in FIG. 9, are powered up to 0.3V internal differential precharge pulses P0 and /P0 by using the precharge buffer 1702, so the large load capacitances are quickly driven. After precharging, external address inputs, A0-A7, are validated by the address buffers AB0-AB7 and the precharge pulses P0 and /P0. Then, internal (0.3V) differential addresses, a0 and /a0, . . . , and a7 and /a7, are enabled. The internal addresses a0 and /a0, . . . , and a7 and /a7 are decoded by the address decoders (row-NAND- or row-NOR-decoders) DEC0-DEC255 (shown in FIG. 11(a) or FIG. 12(a)), and one address decoder with all inputs at 0.3V is selected, then a corresponding word line (e.g. word line WL0) is activated to drive 5T cells along the word line WL0 from a low level of −0.3V to a high level of 0.6V. If the low and high levels are the same as the boosted voltages of 5T cells, the necessary number of power-supply voltages is reduced, as mentioned later. Here, AB(L) block (address buffers AB0(L)-AB7(L)) is simplified for ease of explanation although it actually comprises a dual decoding scheme of pre-decoders and main decoders. Note no need for a timing alignment between the internal addresses and the precharge pulses P0 and /P0, since each AB (L) uses a latched circuit (shown in FIG. 8). This circuit configuration is applicable for column-line (YL)-driver, and BL-equalizer and precharger (shown in FIG. 22).

Figure 18:
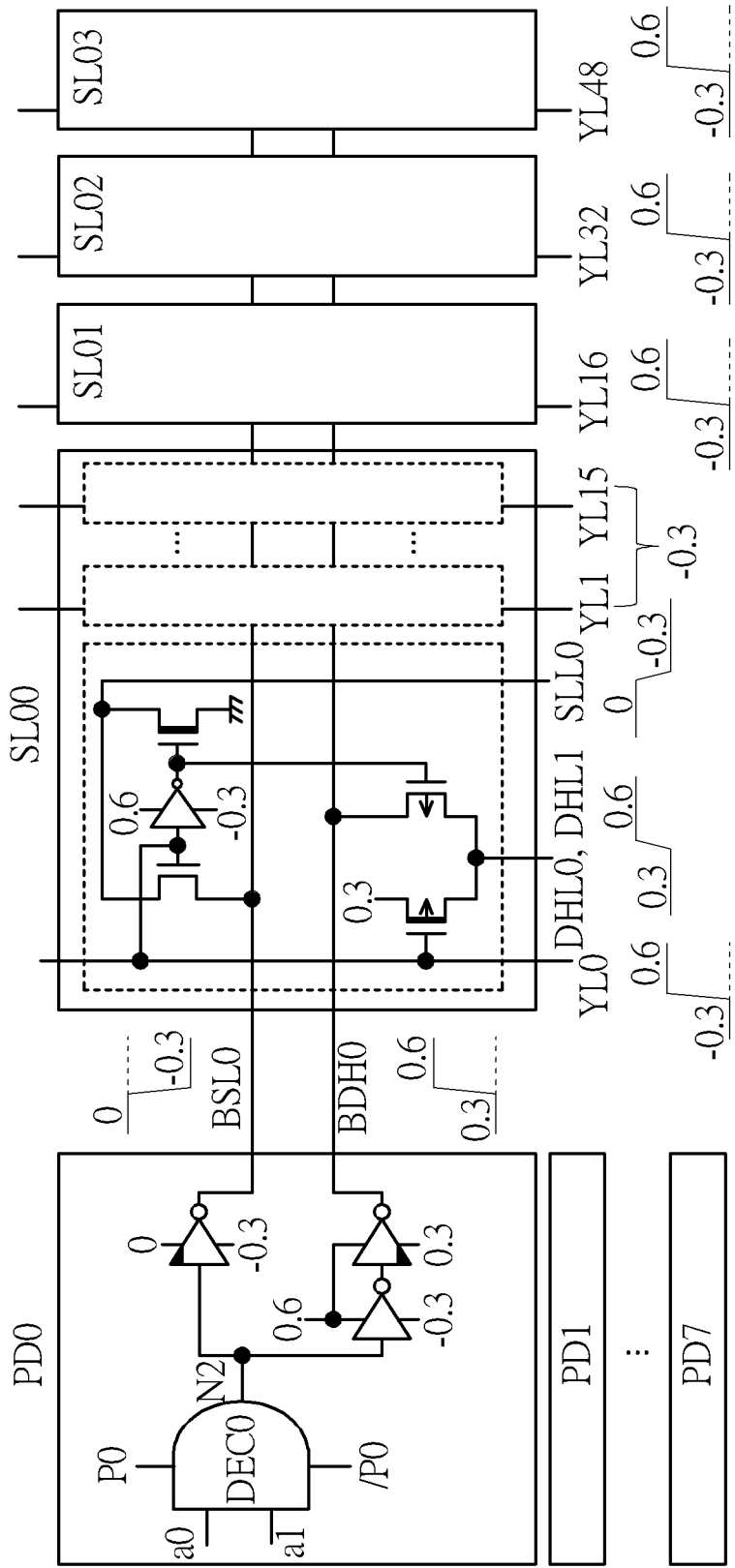
FIG. 18 depicts power drivers (PDs) and selectors (SLs).
Figure 20:
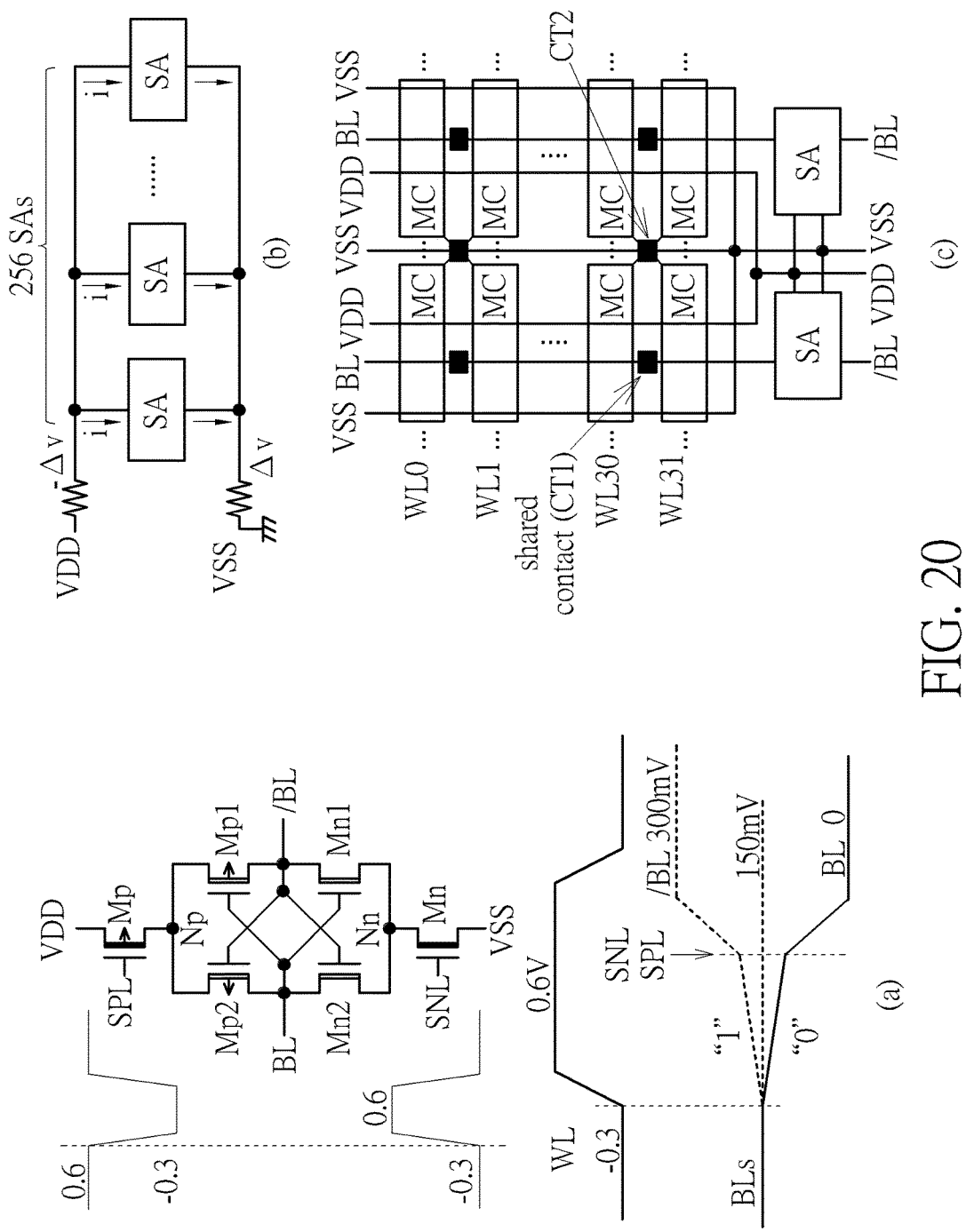
FIG. 20 depicts (a) SA, (b) VDD and VSS lines layout of SA utilizing cell lines in the BL direction, and (c) conventional layout in the WL direction.

FIG. 18 depicts PD- and SL-relevant circuits for a 32-kb sub-array shown in FIG. 15. The selected PD (e.g., PD0) by the 2-input NAND decoder (DEC0) outputs a 0.3V swing pulse, namely, a 0 to −0.3V pulse on an output BSL0, and a 0.3V to 0.6V pulse on an output BDH0. When one of YLs of each SL block (e.g., YL0, YL16, YL32, and YL48) is selected, the corresponding DHL and SLL are driven from 0.3V to 0.6V, and from 0V to −0.3V, while non-selected DHLs and SLLs are kept at 0.3V and 0V, respectively. Here, each SL block simultaneously outputs or inputs two bits through local I/Os by activating one YL (proposed in reference document [2]). This is due to the memory cell layout, resulting in a dual local I/O and global I/O, as shown in FIGS. 16(a) and 20(c).

Figure 19:
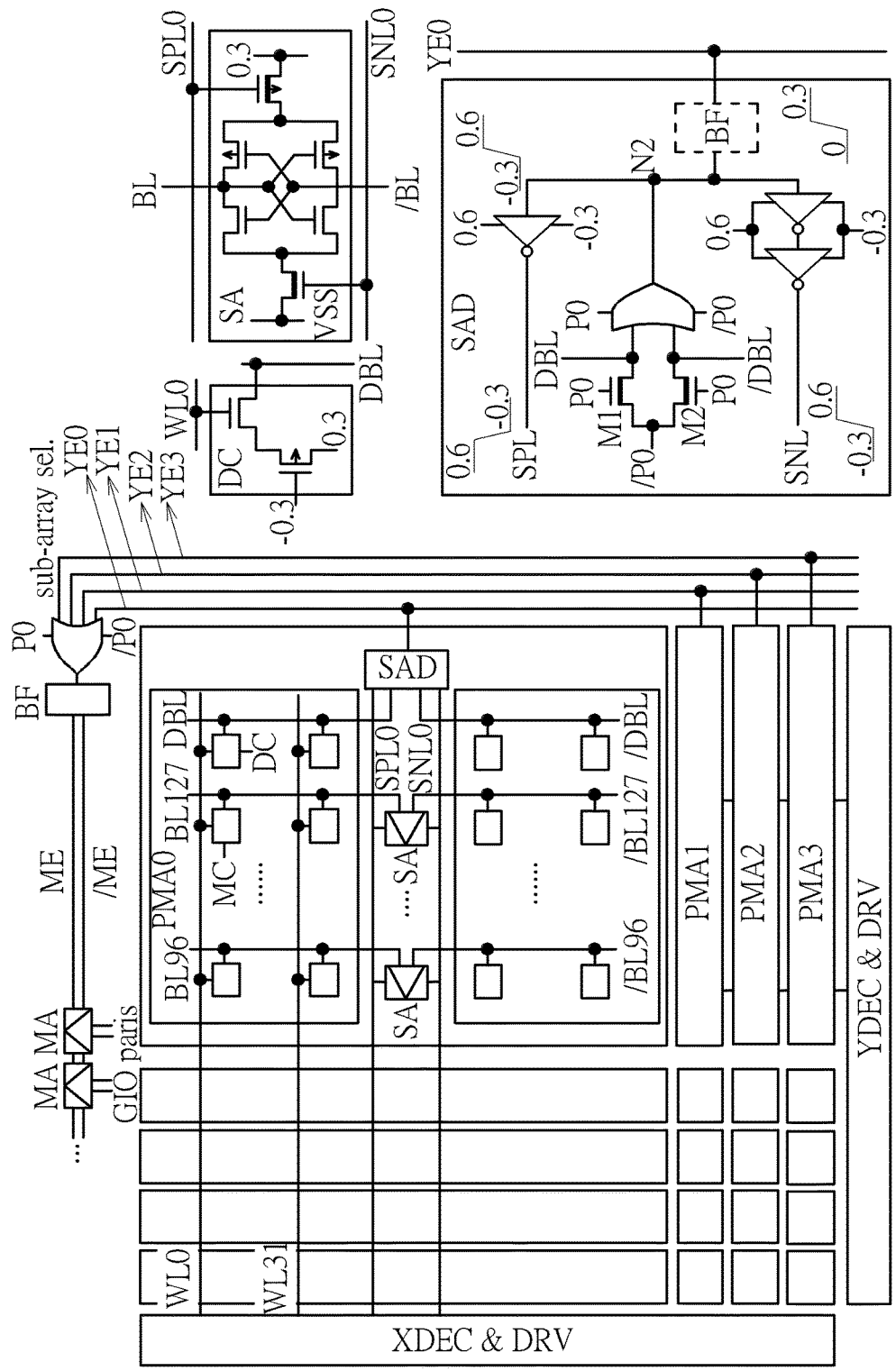
FIG. 19 depicts controls of sense amplifiers (SAs) and main amplifiers (MAs) with dummy cells (DCs).

FIG. 19 shows controls of sense amplifiers (SAs) and main amplifiers (MAs) with dummy cells (DCs) on dummy BLs (DBL and /DBL) placed at the far end of WLs. For example, when the word line WL0 is activated, the DC on the DBL that has been precharged to 0V is charged up to 0.3V, followed by activating SPL0 and SNL0 to activate all SAs along WL0. Simultaneously, Y enable YE0 is activated, so main amplifiers (MAs) are activated by ME and /ME after a read signal on GI/O has been inputted. YE is thus for timing alignment of the GI/O signal and ME activation. In addition, as shown in FIG. 19, SPL and SNL represent supply rails. In addition, SAD represents sense-amp driver.

FIG. 20(a) illustrates a BPS sense amplifier (SA). After a small differential read signal of about 100 mV has been developed, SA is activated by applying a 0.9V large swing pulse to supply rails SNL and SPL to amplify it to 0.3V. Sensing is inherently slow due to an initial BL-voltage of 150 mV, thus calling for such a large swing and low-Vt for MOS Mn and Mp, coupled with BPS. A medium Vt for cross-coupled MOS Mp1, Mp2, Mn1, Mn2 are desirable for stable and low-power sensing as follows. For example, let's consider the case where a differential signal voltage for "1" read is vs on the way to 300 mV with /BL-voltage (V/BL)=VDD/2+vs and BL-voltage (VBL)=VDD/2. For SA to continue to turn on Mn2 with turning off Mn1 (i.e., to avoid unnecessary discharging /BL), V/BL=VDD/2+vs>Vt (Mn2) for Mn2 on, and VBL=VDD/2<Vt(Mn1) for Mn1 off must be satisfied. If Vt(Mn1)=Vt(Mn2)=0.2V (i.e., a medium Vt) at VDD=0.3V, the condition is satisfied by vs>50 mV, implying that SPL and SNL must activate SA after vs is developed to 50 mV. A large Vt (e.g., RVT), however, can be used for Mn1 and Mn2, if SA is activated after BL has been completely charged up to 0.3V or discharged to 0V. In this case, a slower speed is involved due to need for a waiting time. However, this doesn't necessitate such a medium Vt.

Even if BPS solves slow-speed problems of other peripheral circuits, an inherent slow sensing speed that comes from the layout eventually prevents the whole SRAM speed. In the conventional layout (FIG. 20(b)), a set of VDD and VSS lines running into the WL(horizontal) direction is commonly used by many (e.g., 256) SAs. Each power line is thus raised by Δv, while the SAs are simultaneously activated. Consequently, a voltage bounce Δv appears on the power lines of VDD and VSS, as a result of accumulating sensing currents, preventing high-speed sensing. FIG. 20(c) depicts a concept of the layout to minimize the bounce. In principle, the VDD line and VSS line of each SA are connected to the VDD line and VSS line of cells (MCs) running along the BL direction, respectively. In practice, when the actual cell layout is taken into consideration, the connection is a little bit complicated, as shown in FIG. 20(c). This proposal (FIG. 20(c)) minimizes Δv without such accumulation of the current, enabling a fast sensing. Of course, it is acceptable that only the VDD line of SA is connected to the VDD line of cells, which comes from memory-cell layouts (see FIGS. 30 and 34).

Figure 21:
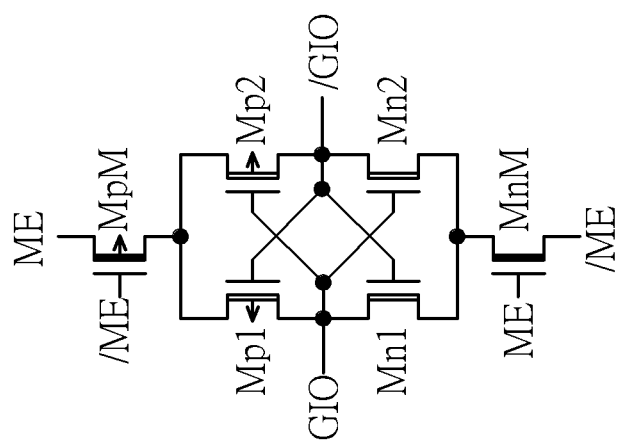
FIG. 21 depicts main amplifier (MA).

FIG. 21 shows a main amplifier MA (FIG. 19) applying GS-DD to MOS MpM and MnM for fast and low-leakage sensing. Activations ME and /ME are applied after a read signal has been developed on a pair of GI/O that was precharged to VDD/2. Vts of cross-coupled MOS Mp1, Mp2, Mn1, Mn2 are desirable to be medium, as those of SAs mentioned before. Here, MA is designed to be off during write with turning off the MOS MpM and MnM (see FIG. 19).

Figure 22:
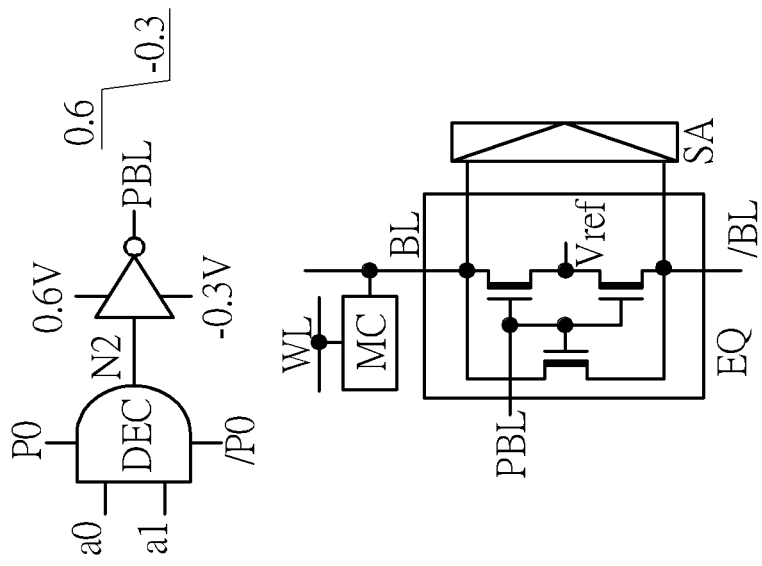
FIG. 22 depicts BL-equalizer and precharger (EQ).

FIG. 22 shows a BL-equalizer and precharger (EQ). Only one 0.9V precharge pulse PBL belonging to the selected sub-array is activated for low power by a two-input NAND decoder and driver, as in the word driver. Note that the precharge pulse PBL must be on after the selected WL is off for stable operations. Otherwise a malfunction may occur since BL-voltage precharged to VDD/2 is written to the memory cell.

Figure 23:
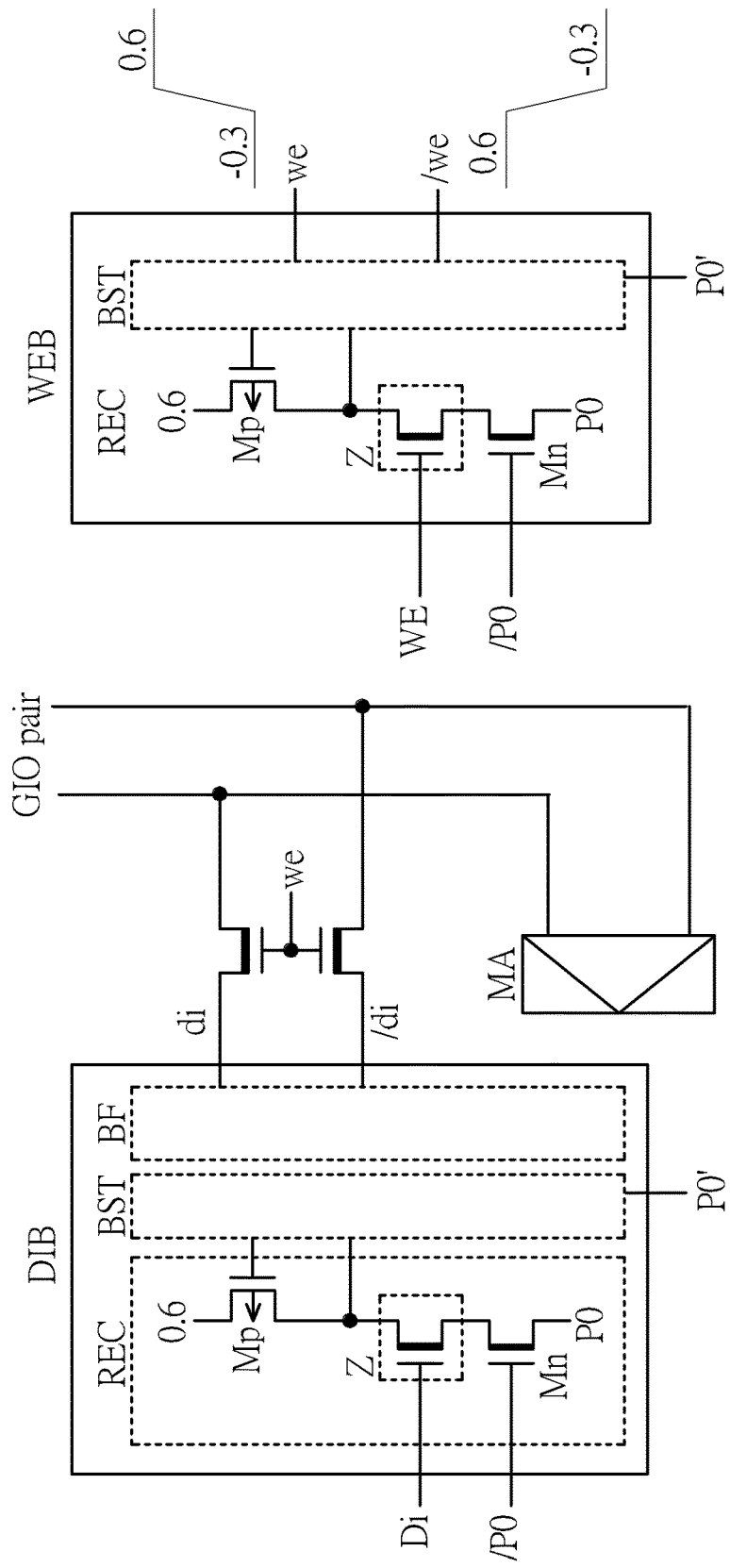
FIG. 23 depicts data-input buffer (DIB) and write enable buffer (WEB) with BPS and GS-DD.

FIG. 23 shows data-in (Di) buffer (DIB) and write enable (WE) buffer (WEB), both of which consist of the BPS basic circuit. A 0.3V differential write data is inputted to a GI/O pair.

(3) No. of Necessary Power Supply for a Given VDD

For 5T SRAMs to be more practical, the number of necessary supply voltages must be reduced to an acceptable level. For a given VDD with a tolerable margin of ±10%, VDH and VSL tailored to the cell can be used for peripheral circuits, thus maintaining the necessary number to the same and making SRAM designs simpler. Note that in prior art at VDD=0.5V, the number was unconsciously decided to be five in total. They were VDD=0.5V, −0.2V, and 1V for periphery, and VDD=0.5V, VDH=0.7V, VSL=−0.2V, and Vref(=VDD/2=0.25V) for memory cells. Note that −0.2V (i.e., −5 in FIG. 3) and 1V were used for the off level and on-level of WL-pulse, respectively, and 0.5V was used for other conventional peripheral circuits. For VDD=0.3V, however, if BPS and GS-DD schemes are applied to peripheral circuits without paying attention to the number, the number further increases to be impractical. Fortunately, however, even in this case, the number is maintained as follows.

Figure 1:
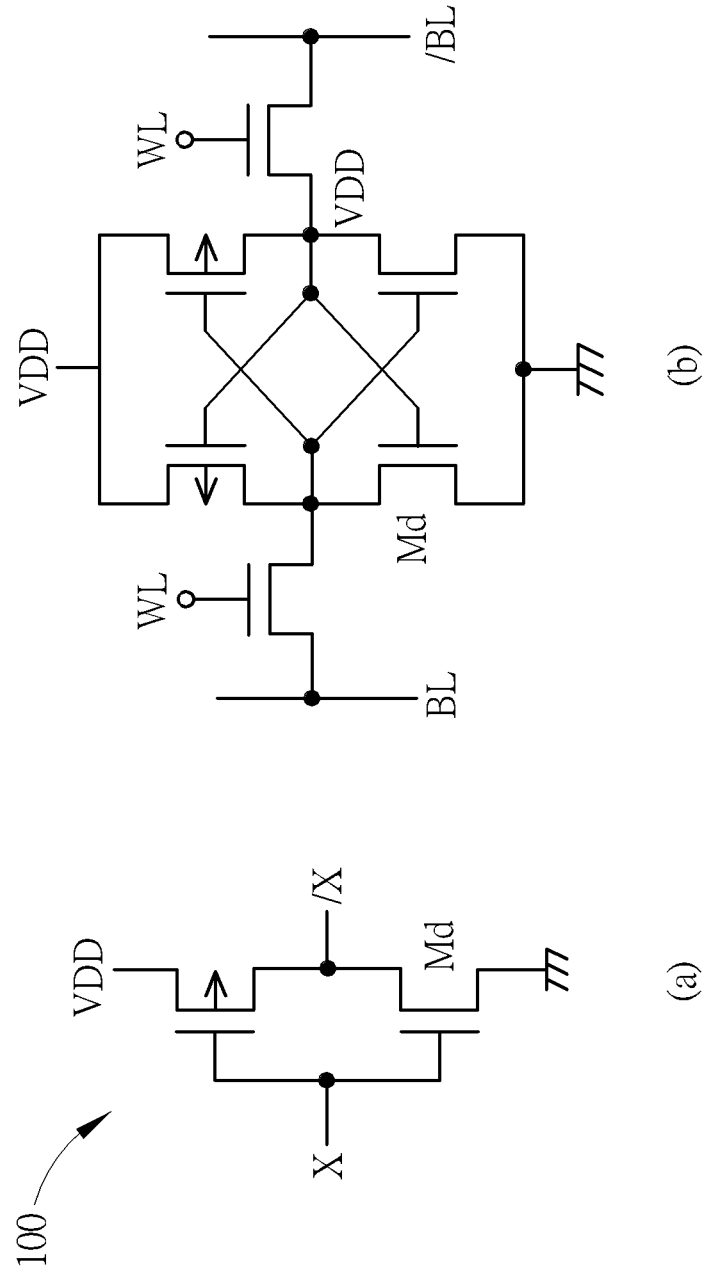
FIG. 1 depicts a conventional inverter and a conventional 6T SRAM cell.
Figure 2:
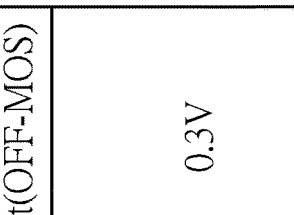
FIG. 2 depicts prior arts of CMOS inverter with boosted power supplies (BPS) and symbols of circuits and MOS.
Figure 3:
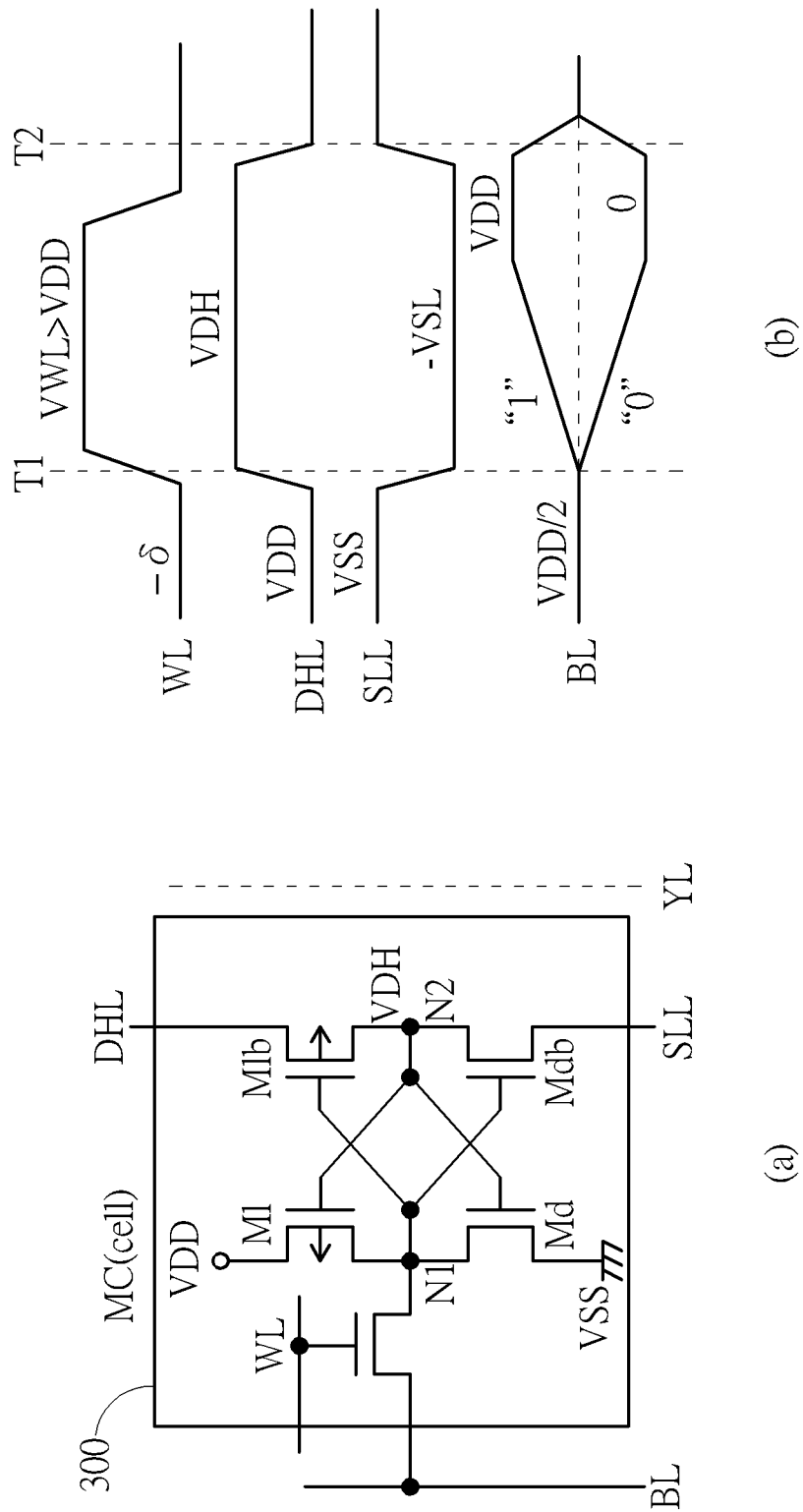
FIG. 3 depicts the prior art of dynamic BPS 5T cell and timing diagram thereof.
Figure 4:
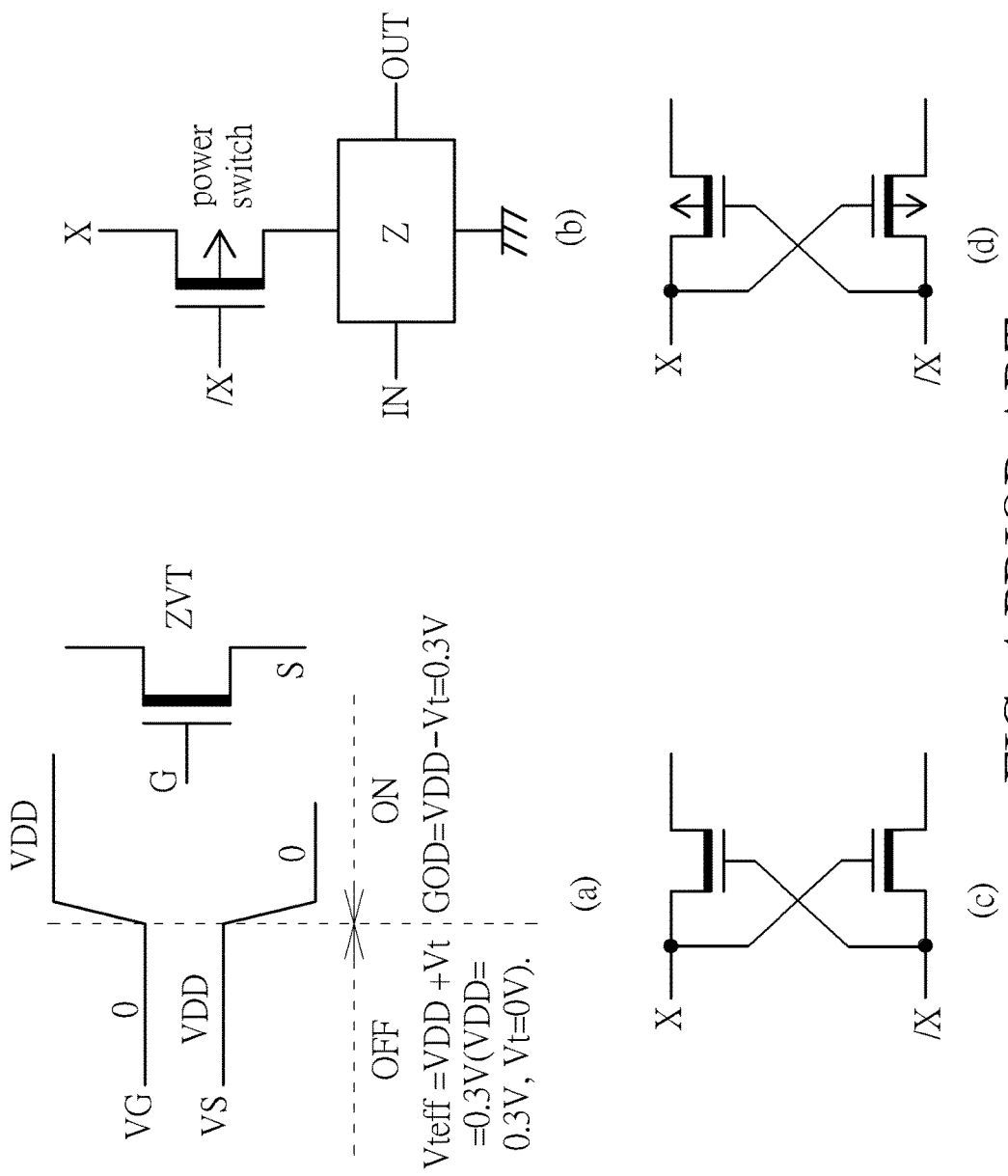
FIG. 4 depicts prior art of gate-source differentially-driven scheme (GS-DD), applications to a power switch, nMOS cross-coupled circuit, and pMOS cross-couple circuit.

According to margin analysis of 5T cells with a 28-nm bulk device, it turned out that at VDD=0.3V, a combination of −VSL=0.3V and VDH=0.6V is appropriate. Obviously, such boosted supply voltages are also appropriate for peripheral circuits with BPS and GS-DD schemes, as discussed so far. The combination, however, makes the read speeds of "1"

and "0" of 5T cells imbalanced. This is because "1" read is always slower than "0" read because it is done by inherently slower pMOS Ml (FIG. 3). Thus, for higher speed as a whole with well-balanced speeds, the channel width of Ml, W(Ml), must be larger than W(Md) despite increased memory size. Alternatively, VSL must be larger (i.e., deeper) than (VDH-VDD), resulting in −VSL=−0.35V and VDH=0.6V at VDD=0.3V. Such a deeper VSL is welcome to peripheral circuit, since it allows pMOS in CMOS inverters to use a smaller channel width W for a given speed.

(4) No. of Necessary Power Supply for Wider Range of VDD

If successful operations must be ensured over a wide range of VDD, for example, from 0.3V to 0.9V, common usage of the boosted supply voltages is difficult. This difficulty comes from following different requirements from 5T cells and peripheral circuits. Indeed, BPS scheme is indispensable for high speed and low leakage currents of both peripheral circuits and 5T cells. Even so, for 5T cells, BPS tends to destruct stored data during read operations, thus calling for avoiding destructive read-out (DRO) with ensuring non-destructive read-out (NDRO). There is not such a need from peripheral circuits. The detail is in what follows.

Figure 24:
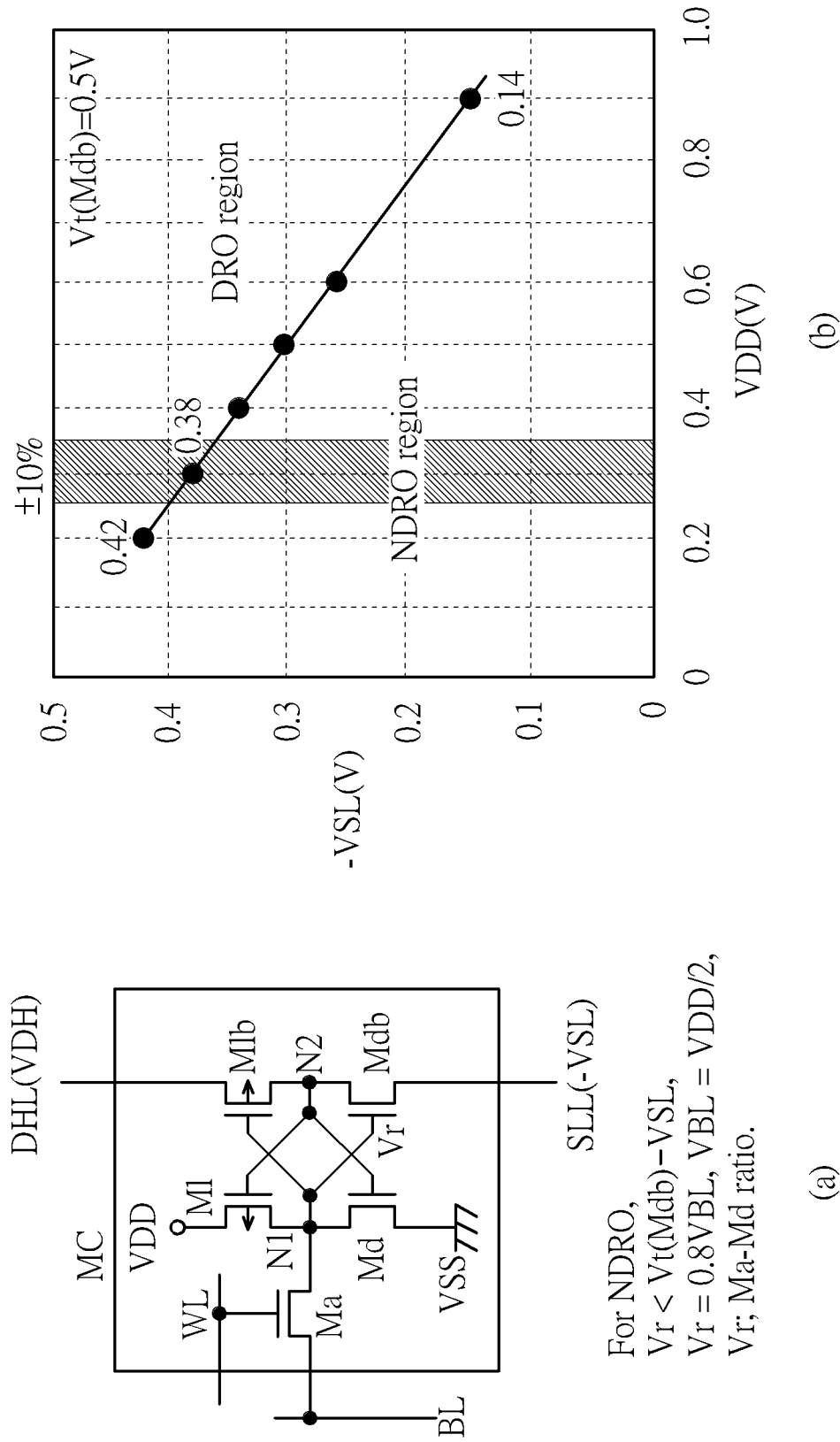
FIG. 24 depicts (a) 5T cell for NDRO, and (b) VSL vs. VDD for NDRO.

FIG. 24(a) illustrates a 5T cell storing "0" with stored node N1 at 0V. DRO occurs when the Ma-Md ratio voltage (Vr) while BL-voltage (VBL) at VDD/2 (=BL precharge voltage) exceeds the effective threshold voltage of Mdb, Vteff(Mdb). Here, Vteff(Mdb)=Vt(Mdb)−VSL where Vt(Mdb) is the actual Vt of Mdb. Since Vr is usually set to about 80% of VBL(VDD/2), DRO condition is given as $$Vr@VBL(=VDD/2) \cong 0.8VDD/2 = 0.4VDD < \{Vt(Mdb) - VSL\}. \quad (1)$$

FIG. 24(b) shows VSL vs. VDD for Vt(Mdb)=0.5V. For example, at VDD=0.3V, NDRO is ensured if −VSL is shallower than −0.38V that is the boundary for DRO and NDRO, while at VDD=0.9V, it is ensured if −VSL is shallower than 0.14V. Hence, to avoid DRO, VDH and VSL for the cell must be less boosted with increasing VDD. In other words, they must be more boosted with reducing VDD. In practice, to ensure NDRO at each VDD with a wide enough margin, the nominal VSL is set to be smaller than the boundary, for example, to about 0.3V at VDD=0.3V. This is also the case for "1" read. The difference (=VDH-VDD) also decreases with increasing VDD, as shown conceptually in FIG. 25(a). In the figure, VDHM and VSLM mean VDH and VSL for memory cells, respectively, while VDHP and VSLP mean those for peripheral circuits.

Figure 25:
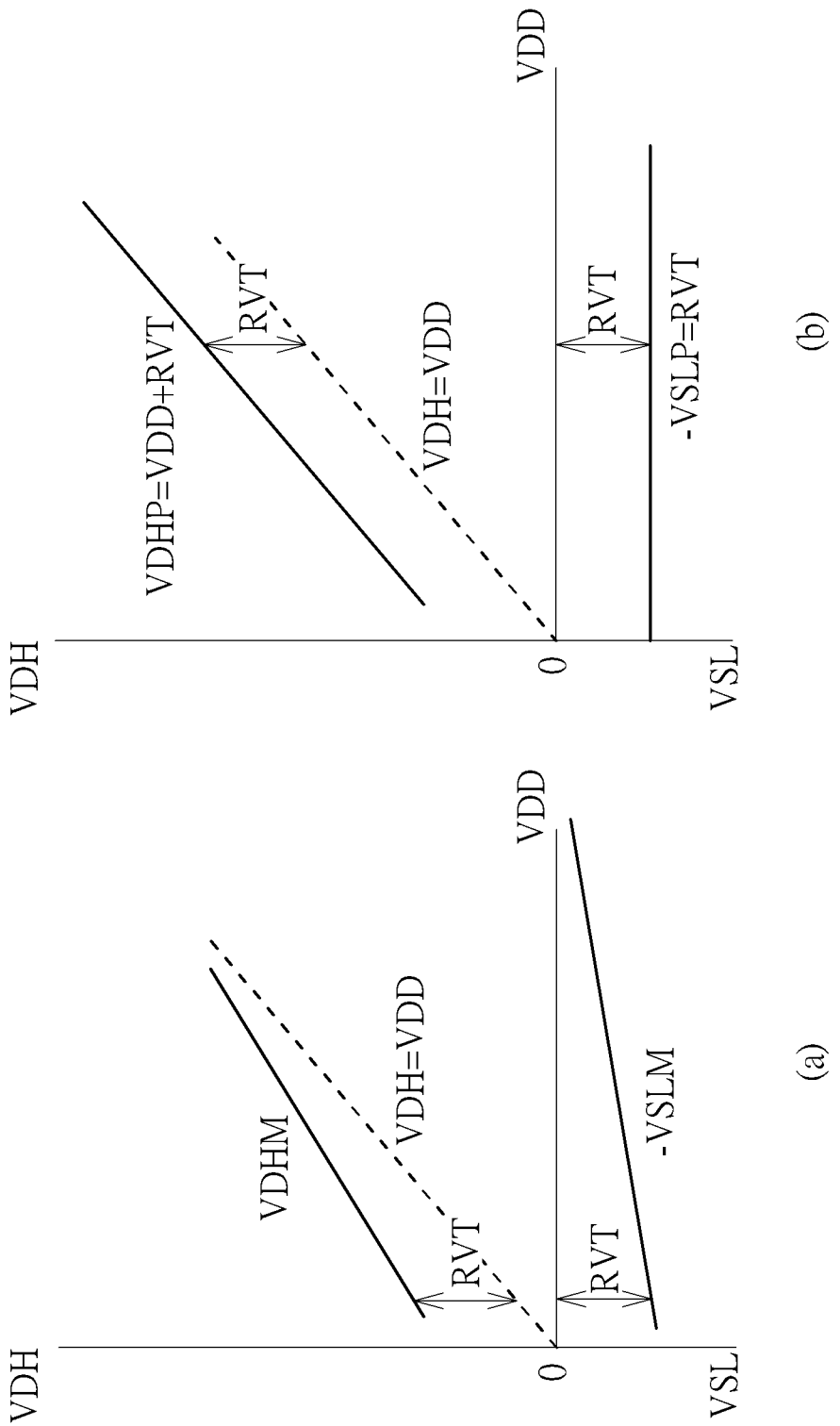
FIG. 25 depicts conceptual comparison of requirements for BPS between (a) 5T cell and (b) periphery.
Figure 26:
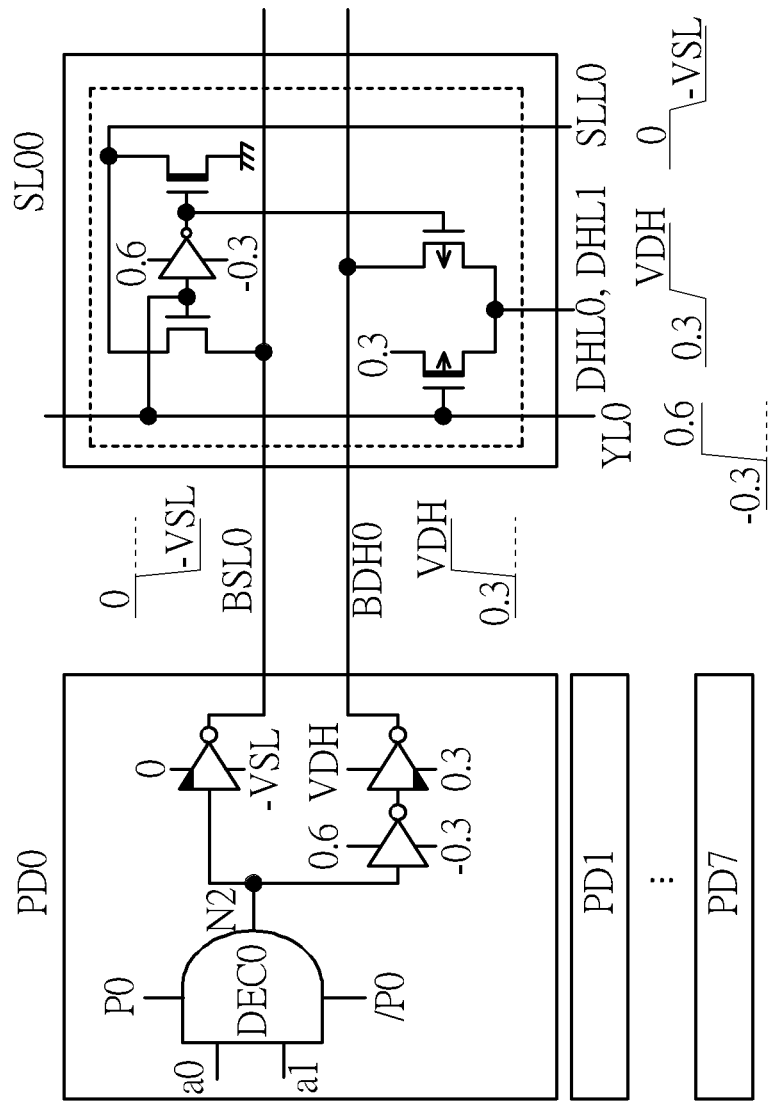
FIG. 26 depicts power driver (PD) and selector (shown in FIG. 18) that generate VDHM and VSLM for the cells, depending on VDD as shown in FIGS. 24 and 25.

For the BPS peripheral (logic) circuits, the situation is different, as shown in FIG. 25(b). The differences, VDH-VDD and VSS-VSL, must be a constant regular Vt (i.e., RVT), independently of VDD. This is because if the differences decrease with increasing VDD, leakage currents of pMOS and nMOS in BPS peripheral circuits increase with increasing VDD. In any event, VDH and VSL characteristics for peripheral circuits must be different from those for the cells, as long as VDD ranges from 0.3V to 0.9V. In this case, two sets of boosted supply voltages, one for the cell (i.e., VDHM and VSLM) and the other for peripheral circuits (i.e., VDHP and VSLP), are needed. Here, VDHM and VSLM show characteristics in FIG. 25(a) while VDHP and VSLP differ from VDD and VSS by a constant (i.e., RVT), as shown in FIG. 25(b). They are applied to the selected DHL and SLL from BDH0- and BSL0-drivers in FIG. 26. In the figure, VDHM=VDHP=0.6V and VSLM=VSLP=0.3V are assumed for simple explanation.

Obviously, a wide margin design, especially for memory cells, is vital, calling for special attention to designs of on-chip voltage converters. Indeed, VDHM and VSLM can be changed according to VDD with the converters by detecting the VDD. To cope with DRO margin sensitive to variations in Vt and temperature, as suggested from Eq. (1), changing VDHM and VSLM according to the variations is also vital. To do so, internal generations of boosted power supply voltages from VDD are indispensable, which are established for dynamic random access memories (DRAMs) (proposed in reference document [3]).

4. Other Preferred Embodiments (1) Basic Circuits

Figure 27:
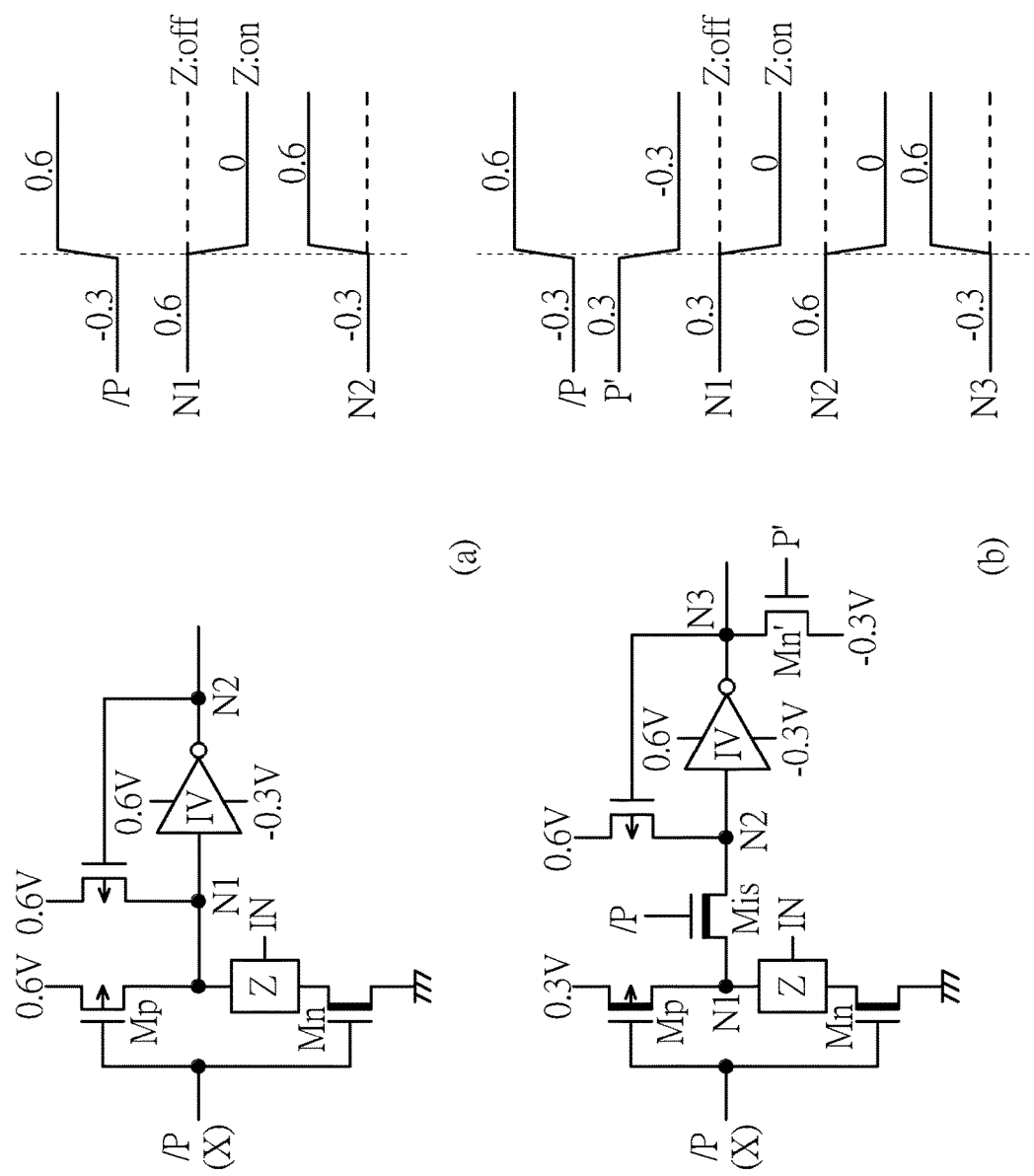
FIG. 27 depicts typical receivers and boosters (a) without Mis and Mn', and (b) with them.
Figure 28:
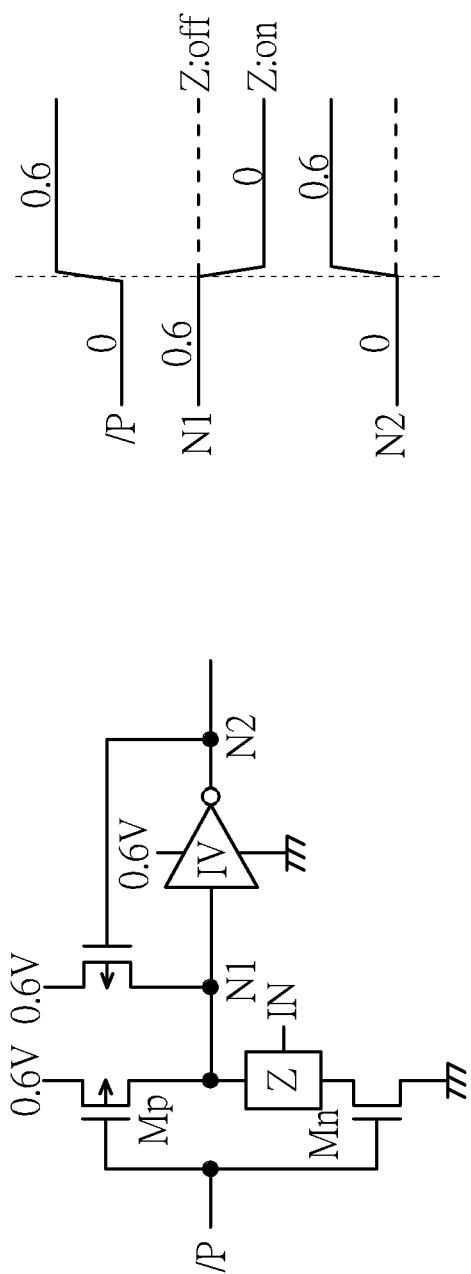
FIG. 28 depicts simple circuit operating only at 0.6V.

There are other alternatives as the receiver and booster, which differ from that in FIG. 7. FIG. 27(a) shows a simpler circuit without a precharge MOS at N2 despite need for a 0.9V-swing precharge pulse (/P). FIG. 27(b) depicts a circuit with an nMOS Mis to isolate N1 operating at 0.3V from N2 operating at 0.6V, allowing N1 to be more quickly discharged for faster operation. FIG. 28 shows another simpler circuit operating only at 0.6V.

Figure 29:
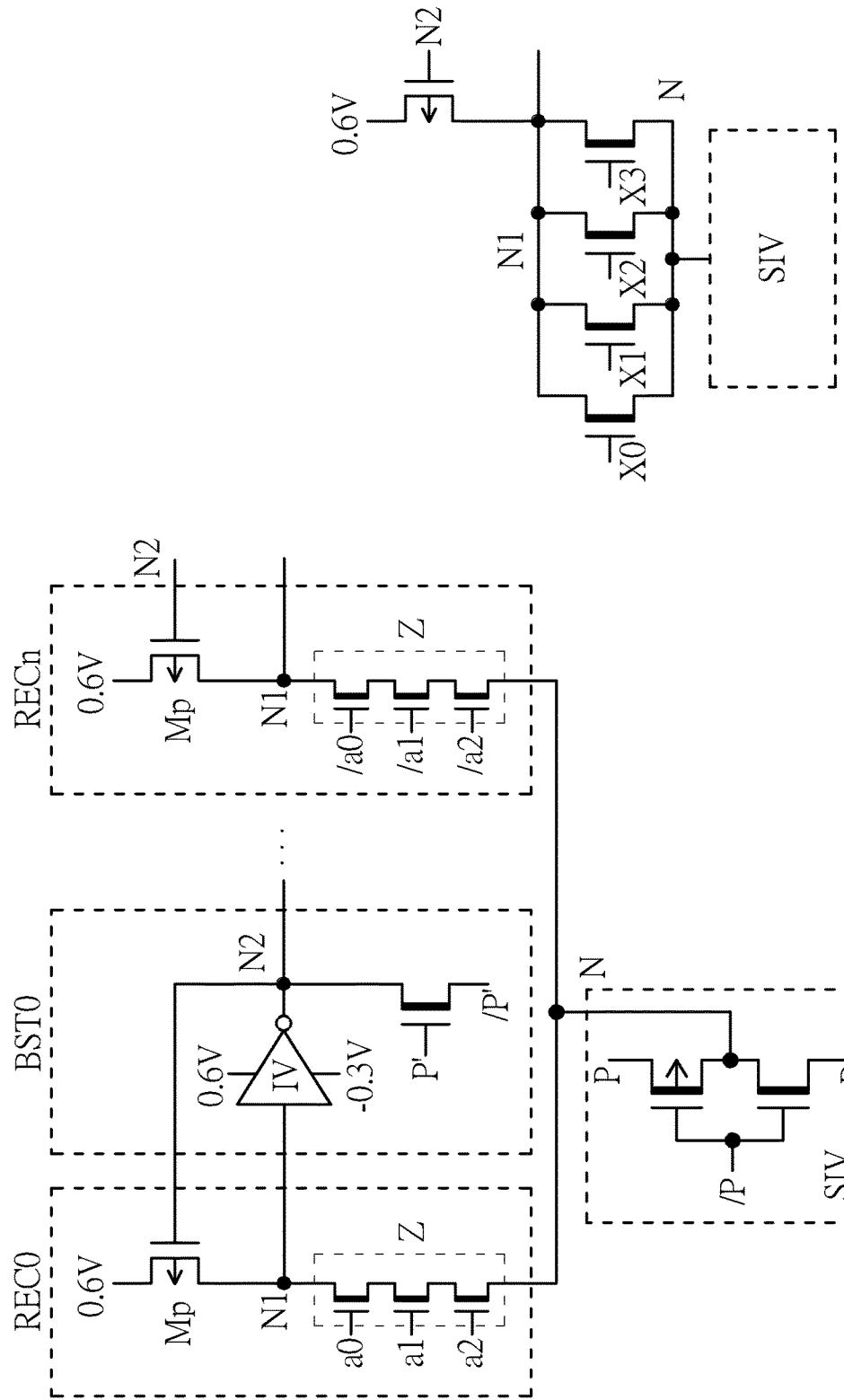
FIG. 29 depicts (a) plural NAND gates for address decoders controlled by an invented static inverter (SIV), and (b) NOR gate with node fixing with SIV.

A NAND decoder block can be smaller if plural NAND decoders are commonly controlled with a node-fixing static inverter SIV using GS-DD scheme, as shown in FIG. 29(a). Thanks to the invented SIV, the common node N having a large capacitance is always fixed to VDD during precharge periods while fixed to 0V during active periods. If a GS-DD MOS Mn in FIG. 7 is used, node N is at a floating voltage during precharge periods, causing instability in some cases. Note that SIV not only fixes the node for more stable operations, but also the fixing is done without leakage current even with 0.3V pulses. This is because two terminals of the inverter are always at the same voltage. SIV operates even at less than 0.3V. FIG. 29(b) depicts a NOR gate with a common node N connecting SIV, in which N is fixed to VDD or 0V without leakage currents, as mentioned above.

(2) Other 5T Cells and Relevant Circuits

Figure 30:
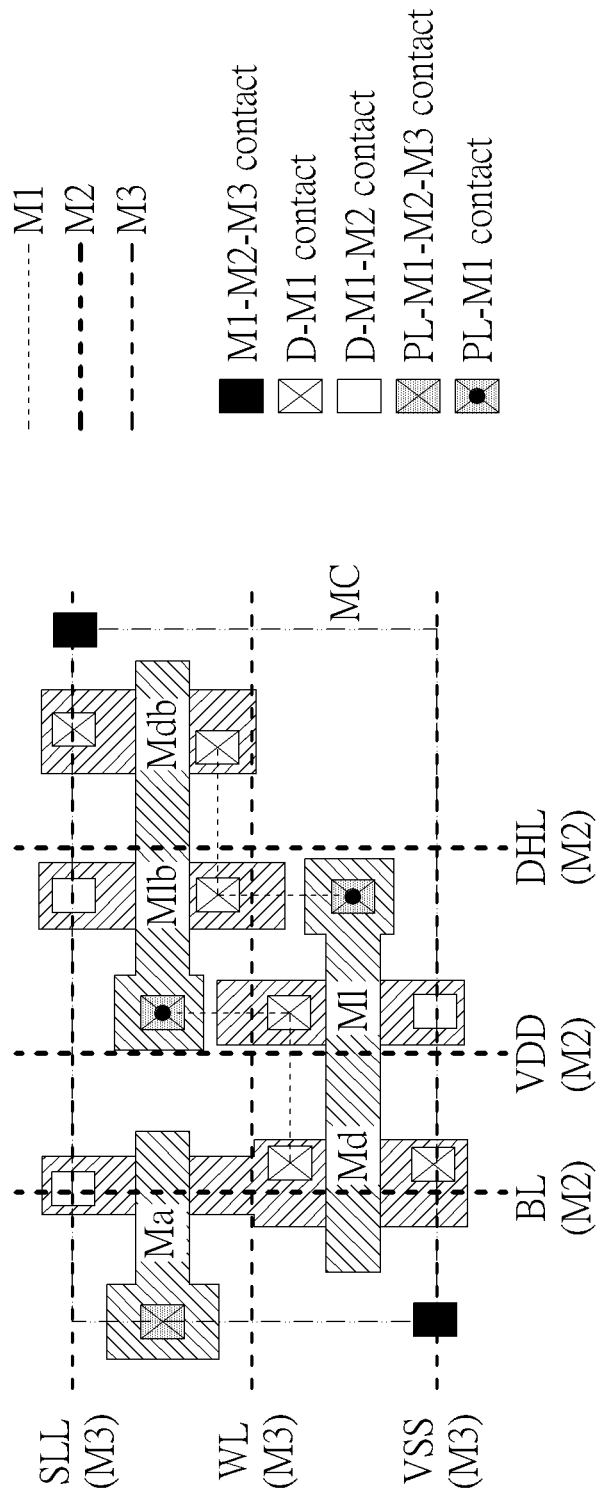
FIG. 30 depicts invented 5T cells featuring VSS-line and SLL perpendicular to VDD-line and DHL.

Based on the 5T cell in FIG. 3, applications of BPS and GS-DD schemes have been discussed in detail so far. In principle, they are applicable even to other 5T cells and arrays. FIG. 30 shows an invented 5T cell layout suitable for a smaller cell. The VSS-line and SLL, which are laid out with metal 3, are perpendicular to VDD-line and DHL, which are laid out with metal 2. Metal 1 is for local interconnects. The column line (YL) in FIG. 3 is eliminated for reducing the cell size. Instead, DHL must work as the column selection, as YL in FIG. 3. To do so, however, special attention must be paid to control the columns switch on each column, as exemplified by an 8-divided 4-kb sub-array in FIG. 31. In this architecture, each pair of sub-arrays (PMA) has a level converter block LCVB and a sub-array selector ASL. Each pair of BLs (BL and /BL) has its own level converter LCV in the LCVB (see FIG. 32). This LCV converts the DHL-pulse (VDD going to VDHM) to a lager voltage-swing pulse for controlling the column switch MOS, My and Myb, and connecting the local I/O (LIOs). The more detailed operations are as follows.

Figure 31:
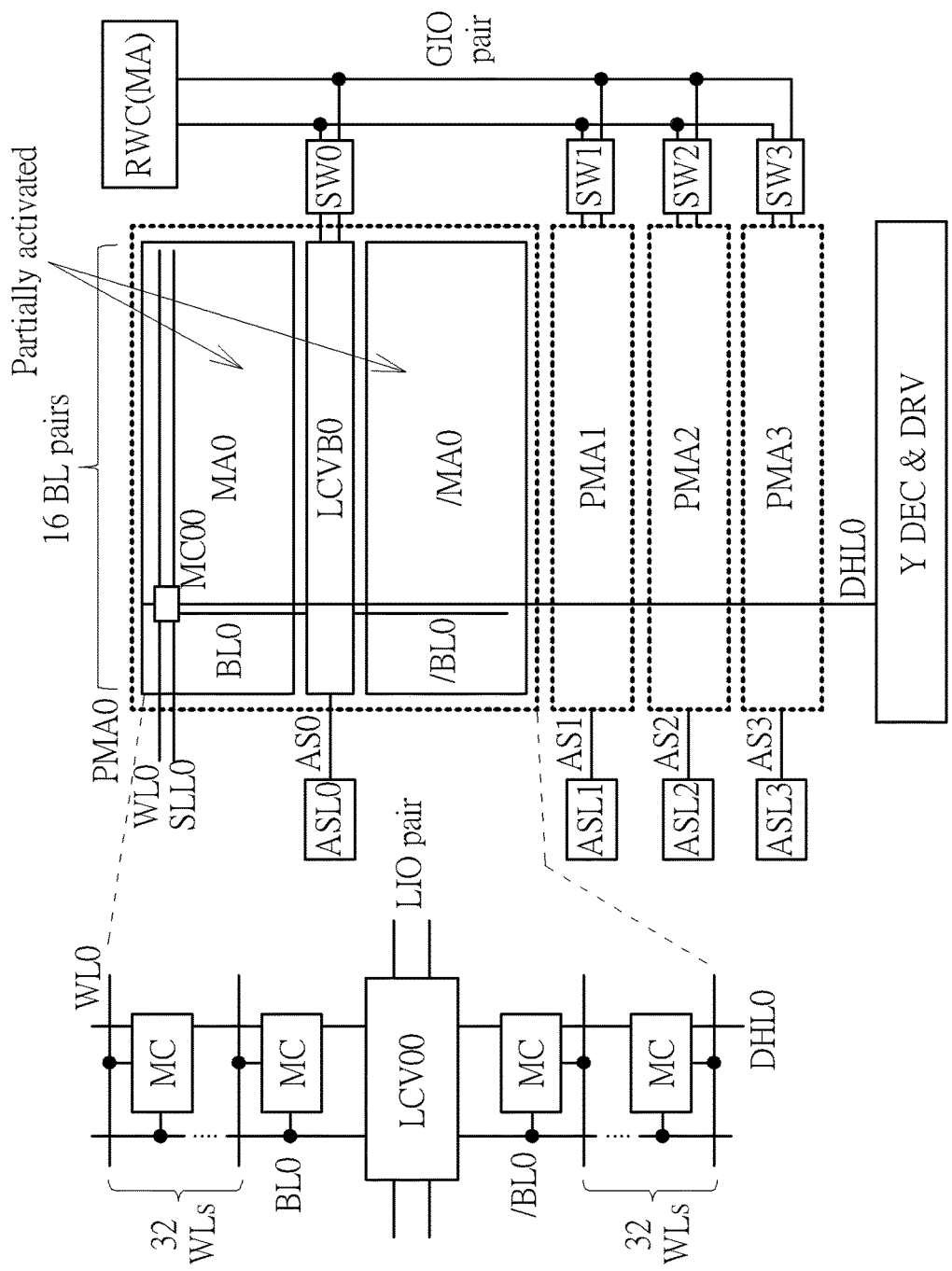
FIG. 31 depicts architecture of 8-divided-BL 4-kb sub-array.

During precharge periods, all BLs, all local IOs (LIOs), and all global IO (GIOs) are precharged to VDD/2 by precharge pulse PBL. During activation periods, a memory cell at the coincidence of boosted DHL and boosted SLL, for example, a memory cell (MC00) in FIG. 31, is selected and activated by means of a driver shown later (see FIG. 33). For read operations, a read signal developed on each pair of BLs is amplified by an SA (FIGS. 20 and 32) on each pair of BLs.

Figure 32:
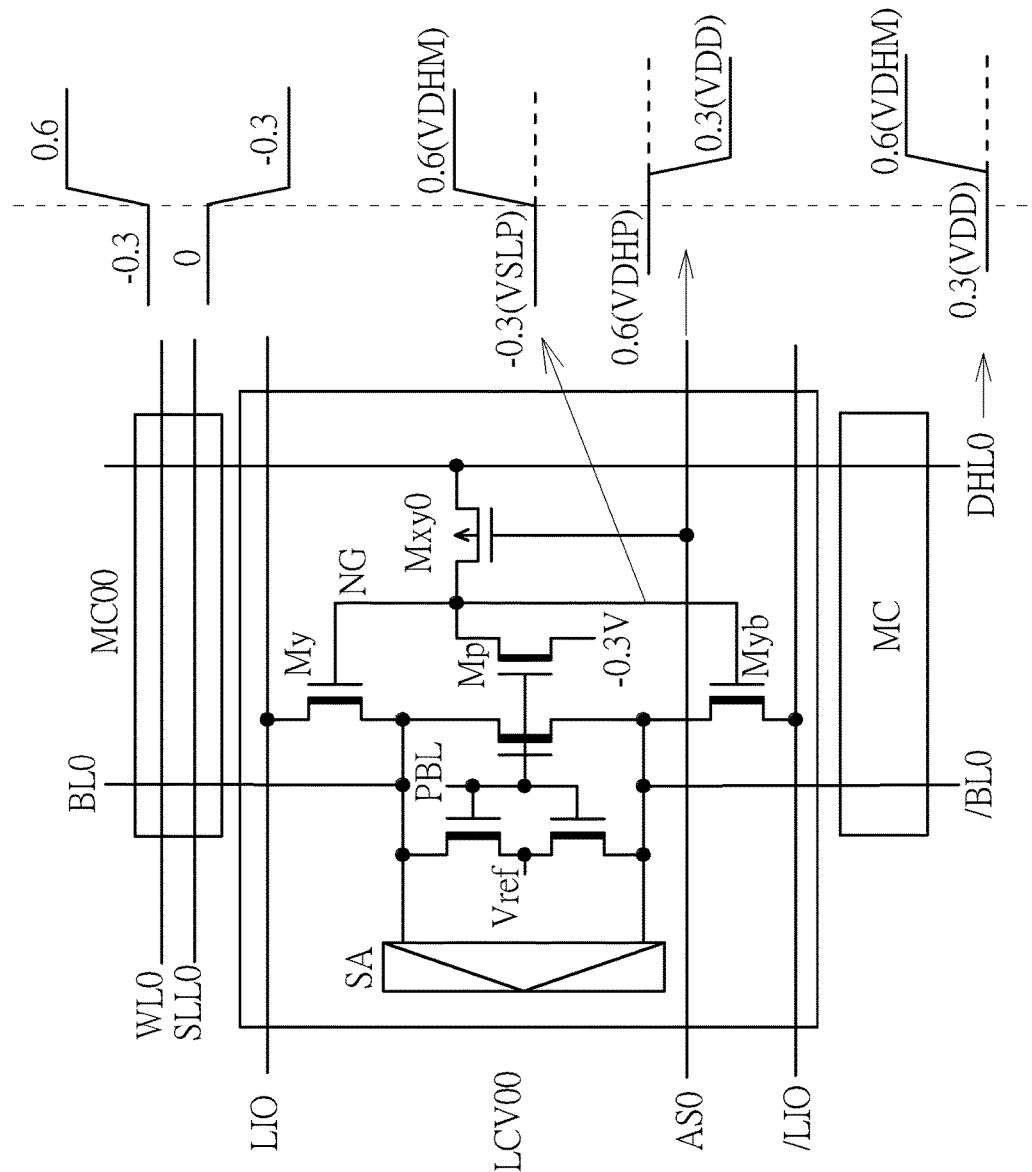
FIG. 32 depicts concept of controls of sub-array and column.

Then, an amplified signal on the selected BLs (i.e., BL0 and /BL0) is outputted to the local IOs (LIO and /LIO) by activating AS0 and boosting DHL0. This is done by changing the selected DHL0 from VDD (0.3V) to a high level of VDHM (0.6V) and the selected AS0 from a high level VDHP (0.6V) to VDD (0.3V), so the selection pMOS Mxy0 turns on, and My and Myb then turn on as a result of changing the gates (NG) from a precharge level of −0.3V to VDHM (0.6V), as shown in FIG. 32. Obviously, non-selected LCVs are kept off, isolating from LIOs, because their Mxys are off due to VDH=VDD for DHLs. It should be noted that the gate-over-drive (GOD) of selected Mxy0, given as VDHM-VDD-Vt(Mxy0), is usually small. For example, it is as small as 0V at VDHM=0.6V, VDD=0.3V, and Vt(Mxy0)=0.3V (=RVT for peripheral circuits), implying that charging up of NG to VDHM is almost impossible or extremely slow, and the speed is sensitive to Vt-variations of Mxy0. The following are the remedies, which allow the GOD to increase to 150-200 mV in total.

(1) Set (VDHM-VDD) to the largest possible value. In fact, (VDHM-VDD) can be larger by 50-100 mV by increasing Vt(Mlb) in the memory cell while maintaining DRO to the same.

(2) Set Vt(Mxy0) to the lowest possible value. An excessively low Vt(Mxy0), however, is hazardous since non-selected LCVs where DHLs at VDD and AS0 at VDD make the Mxy0s weakly on and increase the floating precharge voltage at NG from −0.3V, resulting in malfunction of connecting non-selected LCVs to LIOs. Even so, Vt(Mxy0) can be set to be smaller by 100 mV, thus Vt(Mxy0)=0.2V, taking NG at a floating voltage into account. Although NG is raised by 100 mV due to decrease in Vt(Mxy0), My and Myb in each non-selected LCV are ensured to be off, if their Vts are increased by 100 mV. Even so, GOD of My and Myb are maintained to a high enough because VDHM can be increased by almost the same amount, as explained above.

(3) Set Mxy0 to the Largest Possible Size for Small Vt-Variations.

Figure 33:
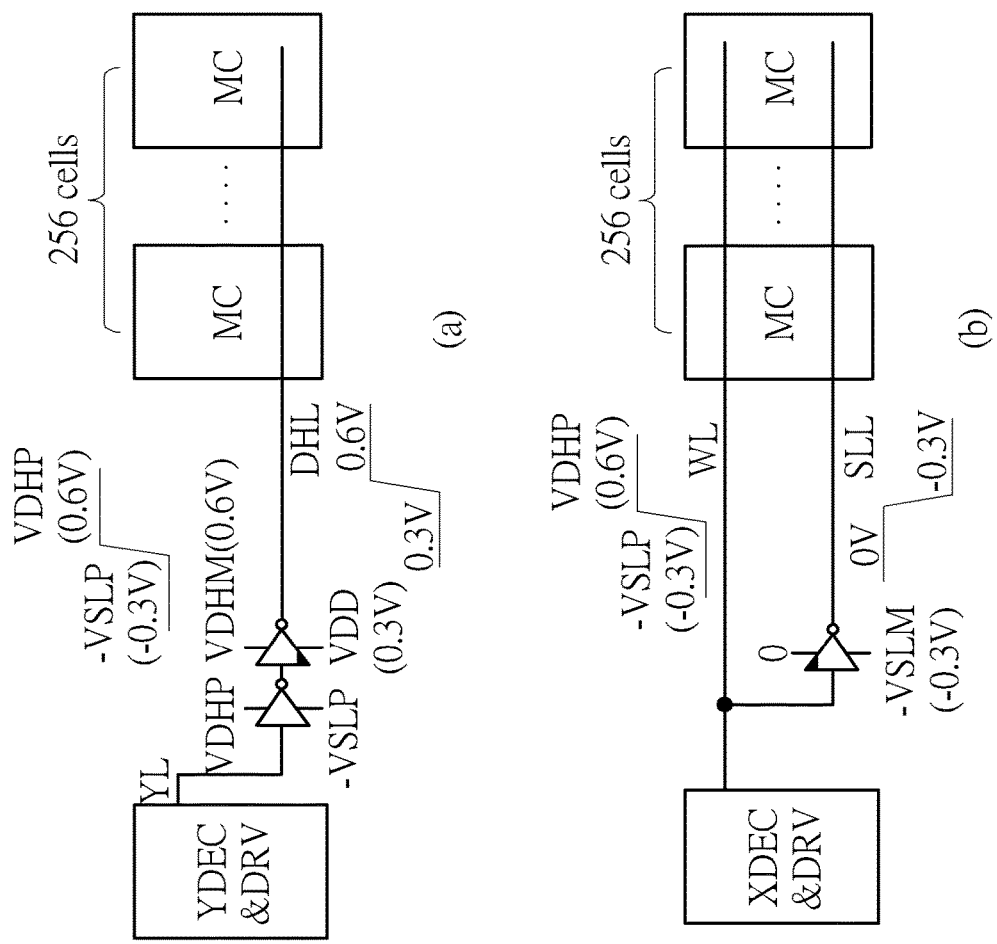
FIG. 33 depicts (a) DHL driver, and (b) SLL driver.

FIG. 33 illustrates a DHL driver, selectively activated by the column driver (i.e., YDEC&DRV), and an SLL driver, selectively activated by WL from the row driver (i.e., XDEC&DRV). YDEC&DRV is almost the same circuit configuration as XDEC&DRV (see FIG. 17). Other peripheral circuits are almost the same as those for the prior art of 5T cell (FIG. 3) described so far.

Figure 34:
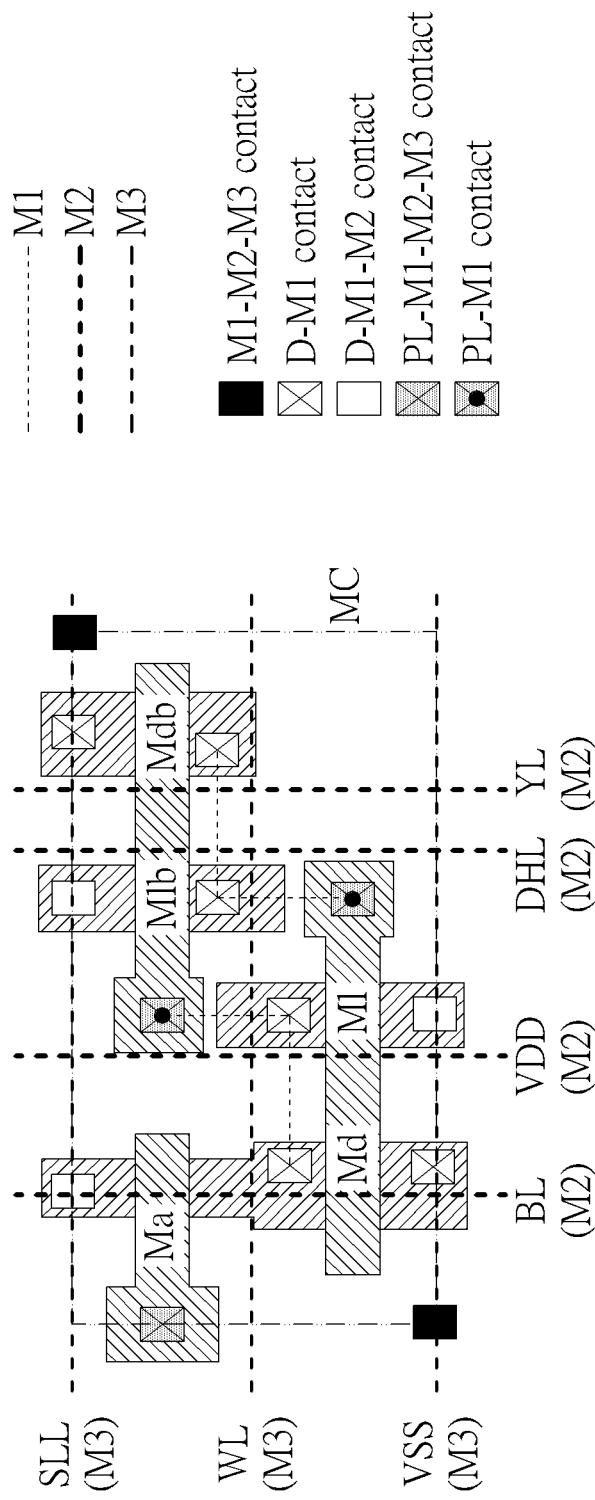
FIG. 34 depicts invented 5T cells featuring VSS-line and SLL perpendicular to VDD-line and DHL.
Figure 35:
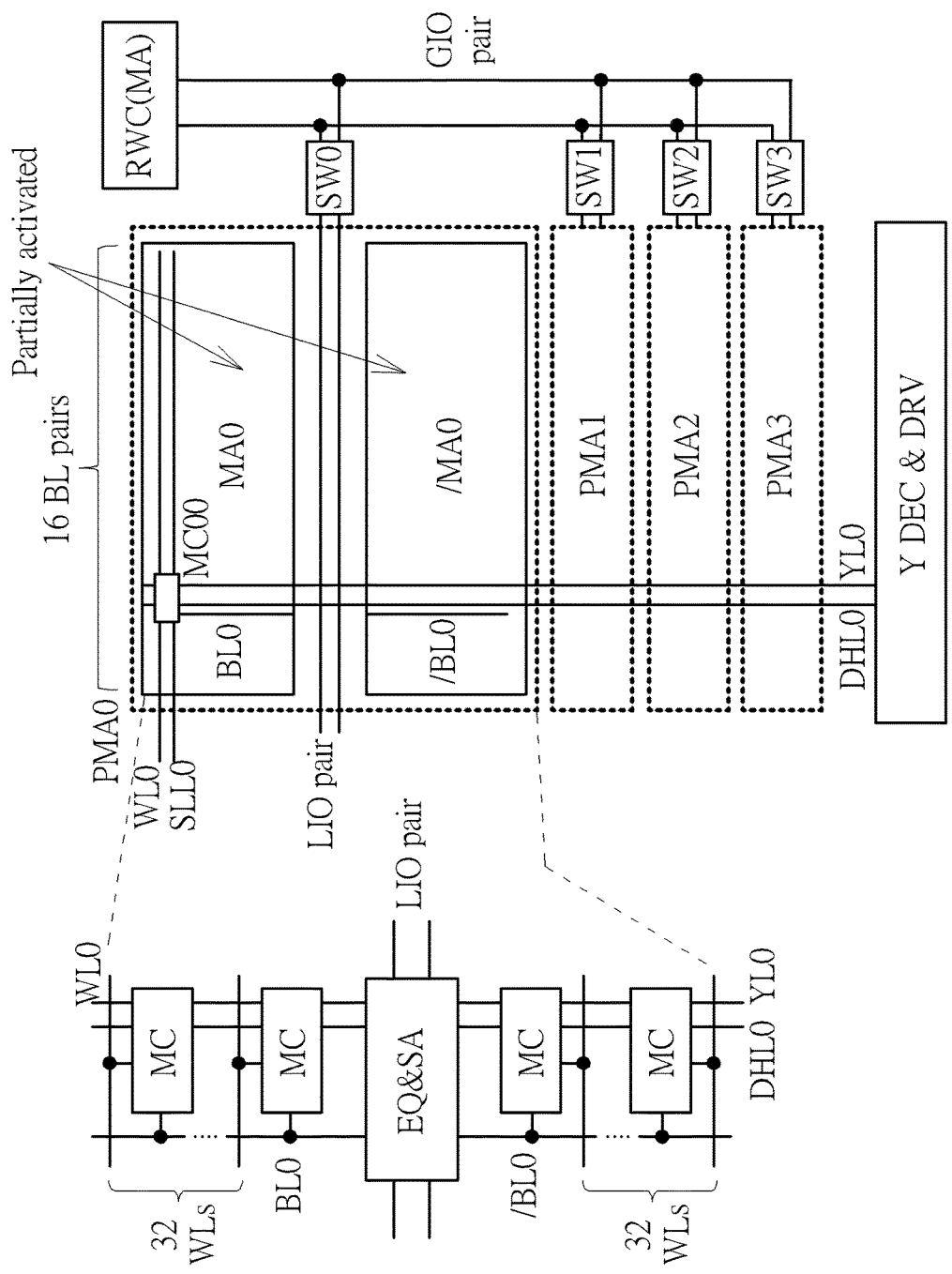
FIG. 35 depicts architecture of 8-divided-BL 4-kb sub-array.
Figure 36:
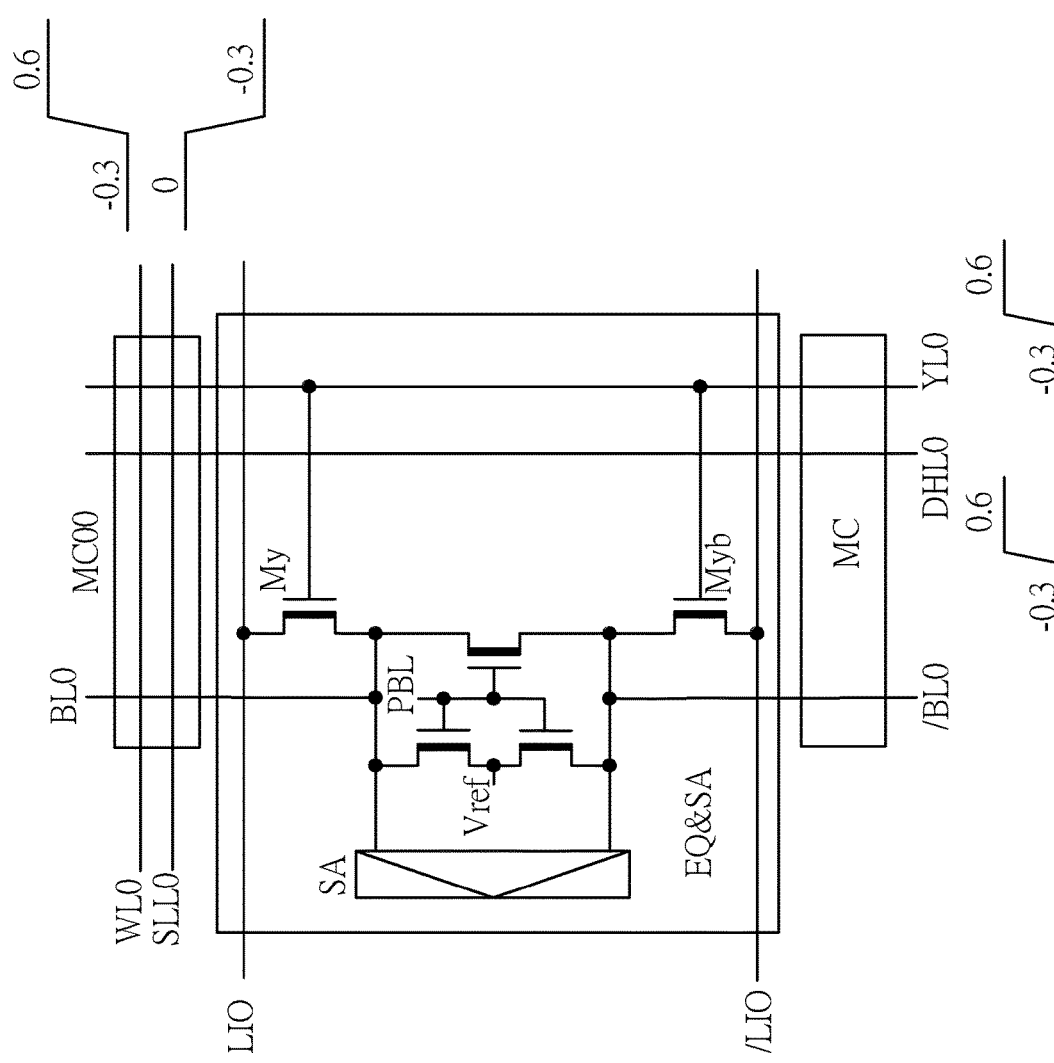
FIG. 36 depicts connection control of a pair of BLs and a pair of LIOs.

FIG. 34 depicts another invented 5T cell layout, in which one column line YL is added to the cell in FIG. 30, as in FIG. 3. Despite increase in cell size, the column selection is much simpler thanks to eliminating LCVs from each column, as shown in FIGS. 35 and 36. Obviously, only one memory cell at the coincidence of boosted DHL and boosted SLL is selected. Although all sets of column switch MOS (My and Myb) in the BL direction are activated, array active power doesn't increase significantly. This is because only one sub-array is activated with activating one WL (i.e. WL0), and communicates with the corresponding LIOs and thus GIOs with turning on the corresponding My and Myb and then row switch (i.e., SW0). On the other hand, other non-selected sub-arrays are kept quiet, namely, all the BLs and LIOs are kept to the precharge level (i.e. VDD/2) with isolating from the GLOs. Of course, if metal 4 is available for YL, there is no area increase in the memory cell.

Figure 37:
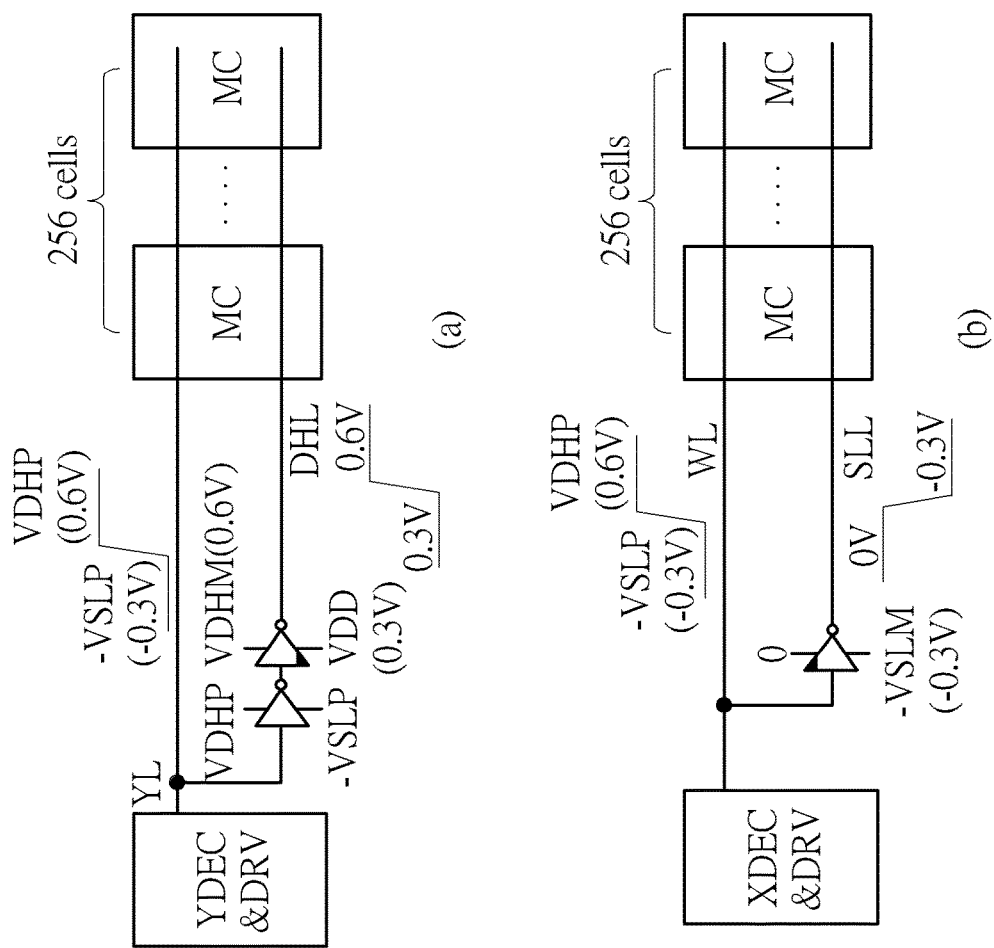
FIG. 37 depicts (a) DHL pulse generator, and (b) SLL pulse generator.

In addition, FIG. 37 illustrates a DHL pulse generator, selectively activated by the column driver (i.e., YDEC&DRV), and an SLL pulse generator, selectively activated by WL from the row driver (i.e., XDEC&DRV). YDEC&DRV is almost the same circuit configuration as XDEC&DRV (see FIG. 17).

In summary, the present invention provides the static random access memory consisting of memory-cell array and the peripheral circuits. The static random access memory cell applies the first voltage and the second voltage to a first cross-coupled inverter of each of the plurality of memory cells of the static random access memory, and a pair of boosted supply voltages to a second cross-coupled inverter of the each of the plurality of memory cells of the static random access memory, wherein the first voltage difference between the first voltage and the second voltage is less than the second voltage difference between the pair of boosted supply voltages. In addition, the static random access memory also applies the boosted power supplies scheme, the gate-source differentially-driven scheme, to the plurality of peripheral circuits. Therefore, the present invention not only can allow basic logic circuits for SoCs and SRAMs to operate at low voltage, low power and high speed, but can also reduce a necessary number of power-supply voltages of the static random access memory.

REFERENCE DOCUMENTS

[1] K. Itoh, "0.5V High-Speed Circuit Designs for Nanoscale SoCs-Challenges and Solutions-," ISIC2011, Singapore, December 2011.
[2] KhajaAhmadShaik, K. Itoh, and Amara "0.5V 350-ps 28-nm FD-SOISRAM Array with Dynamic Power-Supply 5T Cell," IEEE S3S, October 2015.
[3] K. Itoh, VLSI Memory Chip Design, Springer, 2001.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory, comprising:
a plurality of memory cells, wherein each memory cell of the plurality of memory cells has two inverters which are cross-coupled each other and a transistor, a first inverter of the two inverters is connected to a bit-line through the transistor and a second inverter of the two inverters and supplied by a first power supply rail and a second power supply rail and the second inverter is supplied by a third power supply rail and a fourth power supply rail, wherein a first voltage difference is applied across the first power supply rail and the second power supply rail, a second voltage difference is applied across the third power supply rail and the fourth power supply rail, the first voltage difference is less than the second voltage difference, the transistor is further connected to a word line, and the second voltage difference corresponds to a pair of boosted power supplies; and
a plurality of peripheral circuits, wherein the plurality of peripheral circuits use at least one of the pair of boosted power supplies and gate-source differentially-driven circuits.

2. The memory of claim 1, wherein a driver of the plurality of peripheral circuits operates with at least two supply voltages, a load capacitance of the driver is larger than an input capacitance of the driver, and a voltage swing on the load capacitance is smaller than an input voltage swing of the driver.

3. The memory of claim 2, wherein the driver comprises a receiver inputted a first voltage, a booster operating at a second voltage, and a buffer driving the load capacitance at a third voltage, wherein the first voltage and the third voltage are lower than the second voltage.

4. The memory of claim 1, wherein each address buffer of the plurality of peripheral circuits comprises a plurality of address-input NOR gates and a control circuit for activating the each address buffers.

5. The memory of claim 1, wherein the first power supply rail is applied to the plurality of peripheral circuits, and it is 0.5V or less.

6. The memory of claim 1, wherein the boosted power supplies are generated by voltage converters in a chip.

7. The memory of claim 1, wherein a difference between a third supply voltage applied to the second power supply rail and a first power supply voltage applied to the first power supply rail decreases with increasing the first power supply voltage.

8. The memory of claim 1, wherein a difference between a boosted power supply voltage of the plurality of memory cells and the first supply voltage of the plurality of memory cells is smaller than those of the peripheral circuits with increasing the first power supply voltage.

9. The memory of claim 1, wherein a third voltage of two boosted supply voltages is higher than a first voltage of the first voltage difference, and a fourth voltage of the two boosted supply voltages is lower than a second voltage of the first voltage difference.

10. The memory of claim 1, wherein the first inverter comprises first and second transistors coupled in series via their main conducting nodes between the first and second power supply rails; the second inverter comprises third and fourth transistors coupled in series via their main conducting nodes between the third and fourth power supply rails; and a threshold voltage of the third transistor of the second inverter is higher than a threshold voltage of the first transistor of the first inverter.

11. The memory of claim 1, wherein in a read mode of the each memory cell, a corresponding word line is activated in order to select the each memory cell, a voltage difference across the third power supply rail and the fourth power supply rail rises from the first voltage difference to the second voltage difference, and a voltage of a corresponding bit line rises to a first voltage of the first voltage difference from a pre-charge voltage or falls to a second voltage of the first voltage difference from the pre-charge voltage depending on a stored value read from the each memory cell.

12. The memory of claim 11, wherein after the read mode of the each memory cell, a pre-charge circuit of the memory is activated to let the voltage on the corresponding bit line return to the pre-charge voltage.

13. The memory of claim 1, wherein the boosted supplies being applied to the plurality of peripheral circuits is equal to those for the plurality of memory cells.

14. The memory of claim 1, wherein at a precharge period, a first precharge pulse applied to a receiver comprised in partial peripheral circuits of the plurality of peripheral circuits is activated, and a second precharge pulse applied to a booster comprised in the partial peripheral circuits is inactivated.

15. The memory of claim 14, wherein at an active period, the first precharge pulse is inactivated, and the second precharge pulse is activated.

16. The memory of claim 14, wherein the first precharge pulse and the second precharge pulse have a predetermined voltage swing, and the predetermined voltage swing is less than 0.5V.

* * * * *